US010942198B2

(12) United States Patent
Challener

(10) Patent No.: US 10,942,198 B2
(45) Date of Patent: Mar. 9, 2021

(54) MEMS ACCELEROMETER ANTI-REFLECTIVE AND REFLECTOR COATINGS

(71) Applicant: General Electric Company, Schenectady, NY (US)

(72) Inventor: William Albert Challener, Glenville, NY (US)

(73) Assignee: General Electric Company, Schenectady, NY (US)

( * ) Notice: Subject to any disclaimer, the term of this patent is extended or adjusted under 35 U.S.C. 154(b) by 253 days.

(21) Appl. No.: 16/178,791

(22) Filed: Nov. 2, 2018

(65) Prior Publication Data
US 2019/0257854 A1    Aug. 22, 2019

Related U.S. Application Data

(60) Provisional application No. 62/632,698, filed on Feb. 20, 2018.

(51) Int. Cl.
*G01P 15/08* (2006.01)
*G01P 15/093* (2006.01)
(Continued)

(52) U.S. Cl.
CPC .............. *G01P 15/093* (2013.01); *B81B 7/02* (2013.01); *G01H 9/00* (2013.01); *G01P 15/0802* (2013.01); *G01P 15/097* (2013.01); *G02B 26/02* (2013.01); *B81B 2201/0235* (2013.01); *B81B 2203/0127* (2013.01); *B81B 2203/04* (2013.01)

(58) Field of Classification Search
CPC .. G01P 15/0802; G01P 15/093; G01P 15/097; G02B 26/02; G01H 9/00; B81B 7/02; B81B 2201/0235; B81B 2203/04; B81B 2203/0127
See application file for complete search history.

(56) References Cited

U.S. PATENT DOCUMENTS

| 2,984,110 A | * | 5/1961 | Simek | ....................... G01H 9/00 73/464 |
| 4,422,331 A | | 12/1983 | Walker | |

(Continued)

FOREIGN PATENT DOCUMENTS

WO    2017089235 A1    6/2017

OTHER PUBLICATIONS

N.A.D. Stokes, R.M.A. Fatah and S. Venkatesh, "Self-excitation in Fibre-optic Microresonator Sensors", Sensors and Actuators, A21-A23 (1990), pp. 369-372.

(Continued)

*Primary Examiner* — David J Bolduc
(74) *Attorney, Agent, or Firm* — Dority & Manning, P.A.

(57) ABSTRACT

An accelerometer includes a membrane; a laser source, the laser source producing a laser beam, the laser beam directed at the membrane causing the membrane to vibrate; a transparent cap, the transparent cap disposed between the laser source and the membrane; an antireflecting film disposed on an outer surface of the transparent cap; and a detector sensing a reflected portion of the laser beam, the reflected portion including a modulated intensity. An acceleration signal is based in part on the frequency of the modulated intensity of the reflected portion of the laser beam.

20 Claims, 14 Drawing Sheets

(51) Int. Cl.
*G01H 9/00* (2006.01)
*G02B 26/02* (2006.01)
*B81B 7/02* (2006.01)
*G01P 15/097* (2006.01)

(56) References Cited

U.S. PATENT DOCUMENTS

| | | | |
|---|---|---|---|
| 4,429,573 A | 2/1984 | Walker | |
| 4,583,822 A * | 4/1986 | Southwell | G02B 5/289 359/359 |
| 4,671,113 A | 6/1987 | Carome | |
| 4,672,849 A * | 6/1987 | Hoshino | G01H 11/06 257/E27.006 |
| 4,732,599 A * | 3/1988 | Bennion | G01D 5/26 65/30.13 |
| 4,733,561 A * | 3/1988 | Gilby | G01D 5/266 340/870.28 |
| 4,907,846 A * | 3/1990 | Tustison | G02B 1/14 359/359 |
| 4,934,788 A * | 6/1990 | Southwell | C03C 17/002 359/586 |
| 4,938,597 A * | 7/1990 | Gergely | G01H 9/00 356/614 |
| 4,966,437 A * | 10/1990 | Rahn | G02B 1/115 216/33 |
| 5,147,125 A * | 9/1992 | Austin | C03C 17/3417 359/359 |
| 5,170,291 A * | 12/1992 | Szczyrbowski | C03C 17/3417 359/580 |
| 5,420,688 A | 5/1995 | Farah | |
| 5,457,570 A * | 10/1995 | Lu | G02B 1/115 359/361 |
| 5,559,358 A * | 9/1996 | Burns | G01J 5/44 257/415 |
| 5,661,596 A * | 8/1997 | Biro | G02B 1/115 359/359 |
| 5,739,945 A * | 4/1998 | Tayebati | G02B 26/001 257/419 |
| 5,844,236 A * | 12/1998 | Wilson | G01L 1/103 250/227.14 |
| 5,892,860 A * | 4/1999 | Maron | G01D 5/35383 385/12 |
| 5,952,572 A * | 9/1999 | Yamashita | G01C 19/56 73/504.04 |
| 5,981,075 A * | 11/1999 | Ohmi | C23C 14/0694 204/192.26 |
| 6,004,850 A * | 12/1999 | Lucas | H01L 21/0276 257/E21.029 |
| 6,597,490 B2 * | 7/2003 | Tayebati | G02B 26/001 359/291 |
| 6,712,274 B2 | 3/2004 | Dvorkis et al. | |
| 6,807,331 B2 | 10/2004 | Hsu et al. | |
| 7,137,299 B2 | 11/2006 | Meyer | |
| 7,372,613 B2 * | 5/2008 | Chui | G02B 26/001 345/85 |
| 7,684,051 B2 * | 3/2010 | Berthold | G01P 15/093 356/519 |
| 8,375,793 B2 | 2/2013 | Varak et al. | |
| 8,735,225 B2 * | 5/2014 | Palmateer | B81B 7/0038 438/127 |
| 8,817,357 B2 * | 8/2014 | Tao | G02B 26/001 359/290 |
| 8,963,159 B2 * | 2/2015 | Lee | G02B 26/001 257/72 |
| 9,001,412 B2 * | 4/2015 | Chui | G02B 26/023 359/290 |
| 9,134,527 B2 * | 9/2015 | Lee | G02B 26/001 |
| 9,291,507 B1 * | 3/2016 | Wang | H01L 27/14618 |
| 9,618,531 B2 | 4/2017 | Painter et al. | |
| 9,778,042 B2 | 10/2017 | Bramhavar et al. | |
| 9,874,581 B2 | 1/2018 | Tin et al. | |
| 2002/0072015 A1 * | 6/2002 | Miller | G02B 26/02 430/322 |
| 2003/0011480 A1 * | 1/2003 | Fehrenkamp | G01P 15/18 340/573.6 |
| 2004/0156580 A1 * | 8/2004 | Baumann | G02B 6/122 385/16 |
| 2005/0160816 A1 * | 7/2005 | Yu | B81C 3/002 73/514.29 |
| 2005/0184304 A1 * | 8/2005 | Gupta | B81C 1/00214 257/98 |
| 2008/0159687 A1 * | 7/2008 | Donlagic | G01P 15/093 385/13 |
| 2008/0174781 A1 * | 7/2008 | Berthold | G01P 1/023 356/477 |
| 2008/0202237 A1 * | 8/2008 | Hammerschmidt | G01P 15/18 73/504.04 |
| 2009/0109423 A1 * | 4/2009 | Carr | H04R 23/008 356/73 |
| 2009/0226128 A1 * | 9/2009 | Donlagic | G01D 5/268 385/13 |
| 2010/0061073 A1 * | 3/2010 | Oldsen | B81C 1/00317 361/807 |
| 2011/0281068 A1 * | 11/2011 | David | G02B 1/118 428/141 |
| 2013/0032385 A1 * | 2/2013 | Lin | H01L 23/315 174/260 |
| 2013/0327146 A1 | 12/2013 | Meyer et al. | |
| 2014/0016169 A1 * | 1/2014 | Abele | B81B 3/0072 359/199.3 |
| 2014/0346643 A1 * | 11/2014 | Gooch | B81B 7/007 257/620 |
| 2015/0177272 A1 | 6/2015 | Clark | |
| 2015/0293243 A1 * | 10/2015 | Avenson | G01H 9/00 73/1.85 |
| 2015/0321905 A1 * | 11/2015 | Gooch | B81C 1/00317 257/433 |
| 2016/0195397 A1 * | 7/2016 | Bramhavar | G01C 19/722 73/514.26 |
| 2016/0334440 A1 * | 11/2016 | Fertig | G01P 21/00 |
| 2016/0340179 A1 * | 11/2016 | Gooch | B05D 5/061 |
| 2016/0377647 A1 | 12/2016 | Fertig et al. | |
| 2019/0377174 A1 * | 12/2019 | Mihailovich | G02B 5/003 |

OTHER PUBLICATIONS

Palit, Challener, Lopez, Mandal, Xia, Jones, Craddock, Zhao, Irshad, MacDougall, Sanders, Herbst, Villiger, Vo, Henfling, Lindblom and Maldonado, "A Multi-Modality Fiber Optic Sensing Cable for Monitoring Enhanced Geothermal Systems", Thirty-Seventh Workshop on Geothermal Reservoir Engineering, Stanford University, Stanford, CA. Jan. 30-Feb. 1, 2012.

* cited by examiner

US 10,942,198 B2

MEMS ACCELEROMETER ANTI-REFLECTIVE AND REFLECTOR COATINGS

CLAIM OF PRIORITY

This application claims priority to U.S. Application No. 62/632,698, filed on Feb. 20, 2018. The disclosure of U.S. Application No. 62/632,698 is incorporated herein by reference.

STATEMENT REGARDING FEDERALLY SPONSORED RESEARCH AND DEVELOPMENT

This invention was made with Government support under contract number N66001-16-C-4015 awarded by the Defense Advanced Research Projects Agency. The Government has certain rights in this invention.

BACKGROUND

The subject matter disclosed herein relates to a resonant opto-mechanical accelerometer and, more particularly, to a resonant opto-mechanical accelerometer for use in navigation grade environments.

At least some known accelerometers have been developed on micro-electro-mechanical systems ("MEMS") architectures. Some of these accelerometers may include a proof mass mounted on a piezoelectric substrate. As the proof mass experiences a change in acceleration, the proof mass compresses the piezoelectric substrate to generate an output current proportional to the acceleration of the proof mass. Other known accelerometers may include a deformable optical resonator that is compressed, like a piezoelectric substrate, when a proof mass coupled to the optical resonator experiences a change in acceleration.

Many such accelerometers have demonstrated high performance for targeting and inertial applications through the use of temperature post compensation at accelerations of approximately one µg, where one "g" corresponds to the acceleration due to gravity at the Earth's surface and is approximately equal to 9.806 m/s$^2$. However, such accelerometers may not be well suited to service under certain environmental conditions and may not exhibit a dynamic range of operation suitable for use with some inertial navigation systems.

BRIEF DESCRIPTION

In one aspect, An accelerometer includes a membrane; a laser source, the laser source producing a laser beam, the laser beam directed at the membrane causing the membrane to vibrate; a transparent cap, the transparent cap disposed between the laser source and the membrane; an antireflecting film disposed on an outer surface of the transparent cap; and a detector sensing a reflected portion of the laser beam, the reflected portion including a modulated intensity. An acceleration signal is based in part on the frequency of the modulated intensity of the reflected portion of the laser beam.

In another aspect, an accelerometer includes a membrane; a laser source, the laser source producing a laser beam, the laser beam directed at the membrane causing it to vibrate; a transparent cap, the transparent cap disposed between the laser source and the membrane; at least one film disposed on an inner surface of the transparent cap between the laser and the membrane; and a detector sensing a reflected portion of the laser beam, the reflected portion including a modulated intensity. An acceleration signal is based in part on the frequency of the modulated intensity of the reflected portion of the laser beam.

In another aspect, an accelerometer includes An accelerometer comprising: a membrane, the membrane being at least partially transparent; a laser source, the laser source producing a laser beam, the laser beam directed at the membrane causing it to vibrate; a transparent cap, the transparent cap disposed between the membrane and the laser source; a first antireflecting film disposed on an outer surface of the transparent cap; a second antireflecting film disposed on an inner surface of the transparent cap; a reflecting layer disposed beneath the membrane; and a detector sensing a reflected portion of the laser beam, the reflected portion including a modulated intensity. An acceleration signal is based in part on the frequency of the modulated intensity of the reflected portion of the laser beam.

DRAWINGS

These and other features, aspects, and advantages of the present disclosure will become better understood when the following detailed description is read with reference to the accompanying drawings in which like characters represent like parts throughout the drawings, wherein.

Figure 1:
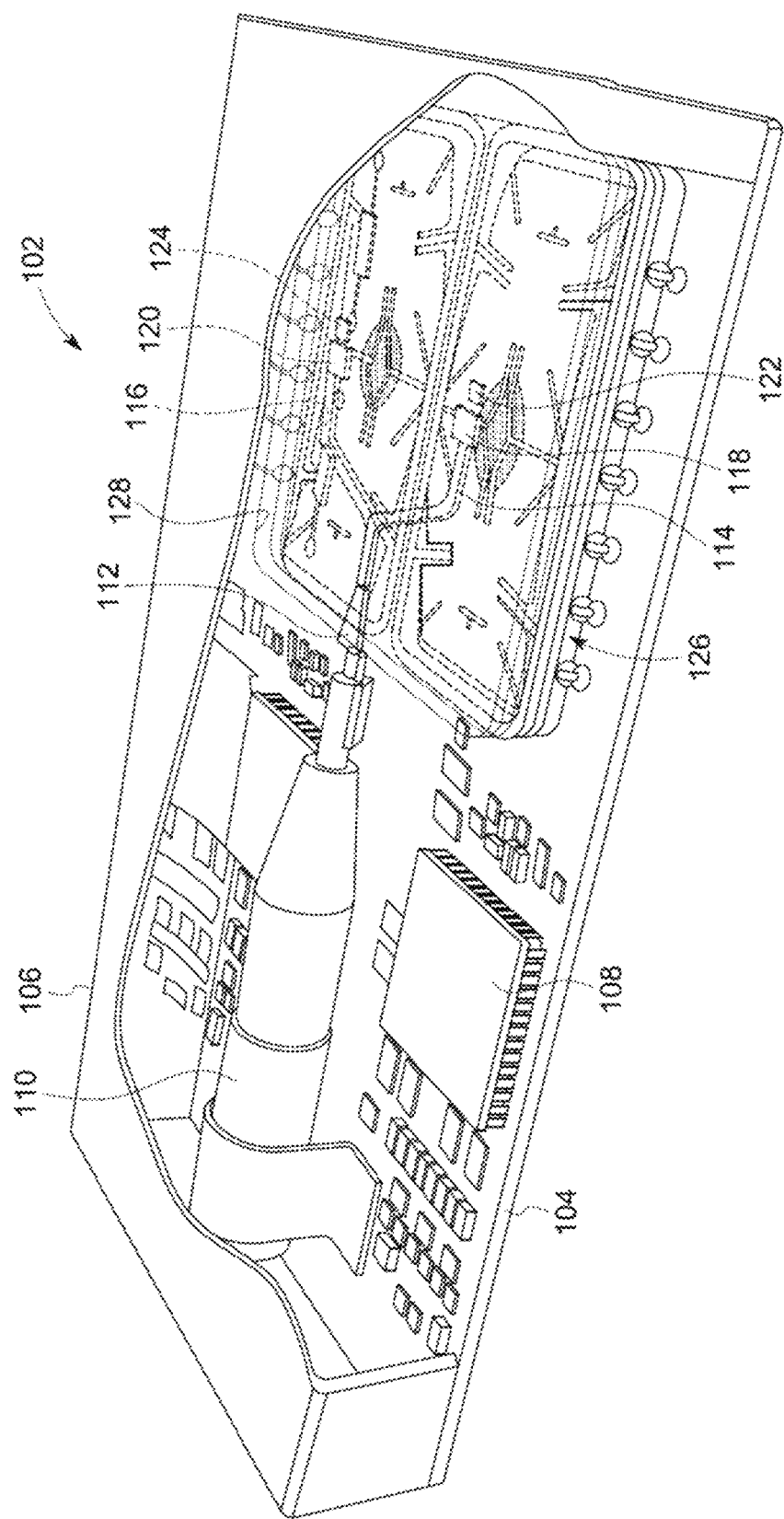
FIG. 1 is a perspective view of an exemplary resonant opto-mechanical accelerometer.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer" and related terms, e.g., "processing device," "computing device", and "controller" are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory includes, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with a user interface such as a mouse and a keyboard. Alternatively, other computer peripherals may also be used that may include, for example, but not be limited to, a scanner. Furthermore, in the exemplary embodiment, additional output channels may include, but not be limited to, a user interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, "g-force" acceleration is a measurement of acceleration caused by a mechanical force exerted on a body, such as an accelerometer, in a direction by a surface supporting the object and preventing the object from free fall. Similarly, as used herein, a unit of measurement of acceleration may be expressed as a "g," which in the international system of units, corresponds to m/s$^2$. One g is thus the acceleration due to gravity at the Earth's surface and is approximately equal to 9.806 m/s$^2$.

Embodiments of the present disclosure relate to a resonant opto-mechanical accelerometer and, more particularly, to a resonant opto-mechanical accelerometer for use in navigation grade environments. As described herein, navigation grade environments include environments associated with and/or onboard various navigational systems, such as, for example, aircraft systems, marine systems, terrestrial systems, and/or munitions systems, such as missile and other ballistic systems. As such, navigation grade environments may expose the resonant opto-mechanical accelerometer to rapidly fluctuating g-forces as well as to extreme environmental conditions.

In addition, as described below, the resonant opto-mechanical accelerometer may be a single axis accelerometer (e.g., a z-axis accelerometer) configured to measure acceleration perpendicular to a resonator plane. However, the resonant opto-mechanical accelerometer may also measure accelerations about other axes (e.g., depending upon the orientation of the accelerometer) and may, in addition, measure accelerations about a plurality of axes (e.g., where a plurality of resonator and/or resonator pairs are utilized).

The resonant opto-mechanical accelerometer includes a light source, such as a laser, a first resonator, and a second resonator. A resonance frequency of each resonator is responsive to an acceleration, and the light source shines a light beam on each resonator. The resonators modulate the light to a frequency that corresponds to the resonance frequency, and the modulated light is sensed at each resonator by a corresponding photodetector. The photodetectors generate first and second electrical output signals in response, and these electrical output signals are used to generate a temperature independent acceleration measurement. More particularly, the first and second resonator are operated as a pair, each having and opposite scale factor, to provide robustness against common mode errors, such as temperature drift. Moreover, a plurality of electrodes are disposed in relation to each resonator, such that one or more proof masses associated with each resonator may be dynamically balanced and/or a scale factor associated with the modulated light increased or decreased as a function of acceleration.

FIG. 1 is a perspective view of an exemplary resonant opto-mechanical accelerometer ("ROMA") 102. ROMA 102 includes a printed circuit board ("PCB") 104. A controller 108 is mounted on PCB 104. As described elsewhere herein, controller 108 coordinates the operation of ROMA 102. In the exemplary embodiment, controller 108 includes one or more processors communicatively coupled to one or more tangible, non-transitory, computer-readable memories.

A light source 110 is also mounted on PCB 104. Light source 110 is any light source capable of generating a beam of monochromatic light and/or any other beam of radiation. In the exemplary embodiment, light source 110 is a laser, such as a continuous-wave laser and/or a pulsed operation laser. Light source 110 may, in addition, be a low power laser, such as, in some embodiments, a laser having an output power ranging from ten milliwatts to fifty milliwatts. Further, in various embodiments, more than one light source may be implemented with ROMA 102. Light source 110 may be operatively coupled to controller 108, such that controller 108 provides one or more control instructions or control signals to light source 110 for the operation of light source 110.

An optical waveguide 112 is coupled to light source 110, such that optical waveguide 112 is capable of receiving and guiding a light beam generated by light source 110. In the exemplary embodiment, optical waveguide 112 is bifurcated and branches into a first branch or first portion 114 and a second branch or second portion 116. Optical waveguide 112 includes any waveguide suitable for the transmission of light, such as any light guide, any fiber optic waveguide structure, any integrated waveguide structure patterned on a cover of ROMA 102 (as described below), and the like.

A first photodetector 122 is disposed at a first output coupler or first end 118 of first portion 114. Similarly, a second photodetector 124 is disposed at a second output coupler or second end 120 of second portion 116. First end 118 may include a mirror, prism reflector, or grating coupler (not shown) configured to redirect a beam of light traveling within first portion 114 of optical waveguide 112 towards a first resonator 126. Likewise, second end 120 may include a mirror, prism reflector, or grating coupler (not shown) configured to redirect a beam of light traveling within second portion 116 of optical waveguide 112 towards a second resonator 128.

In the exemplary embodiment, first resonator 126 and second resonator 128 are mounted on PCB 104 and form a resonator package or resonator pair. In other embodiments, first resonator 126 and/or second resonator 128 are not mounted on PCB 104, and may be located or mounted apart from PCB 104, controller 108, and/or other control electronics.

First resonator 126 and/or second resonator 128 are operatively coupled to controller 108, such that controller 108 provides one or more control instructions or control signals to first resonator 126 and/or second resonator 128 for the operation of first resonator 126 and/or second resonator 128. For example, in some embodiments, controller 108 provides one or more control signals to first resonator 126 and/or second resonator 128 to control the voltages generated by one or more electrodes coupled to each resonator 126 and/or 128 (as described below). Similarly, in various embodiments, controller 108 provides one or more control signals to first resonator 126 and/or second resonator 128 to control the output power of light source 110.

ROMA 102 may, in addition, be enclosed within a housing 106, which may serve as an environmental enclosure suitable to shelter ROMA 102 from air and moisture. In some embodiments, housing 106 is also heat resistant and functions as a heat shield suitable to shelter ROMA 102 from heat generated by a navigation or propulsion system to which ROMA 102 is mounted or coupled.

Figure 2:
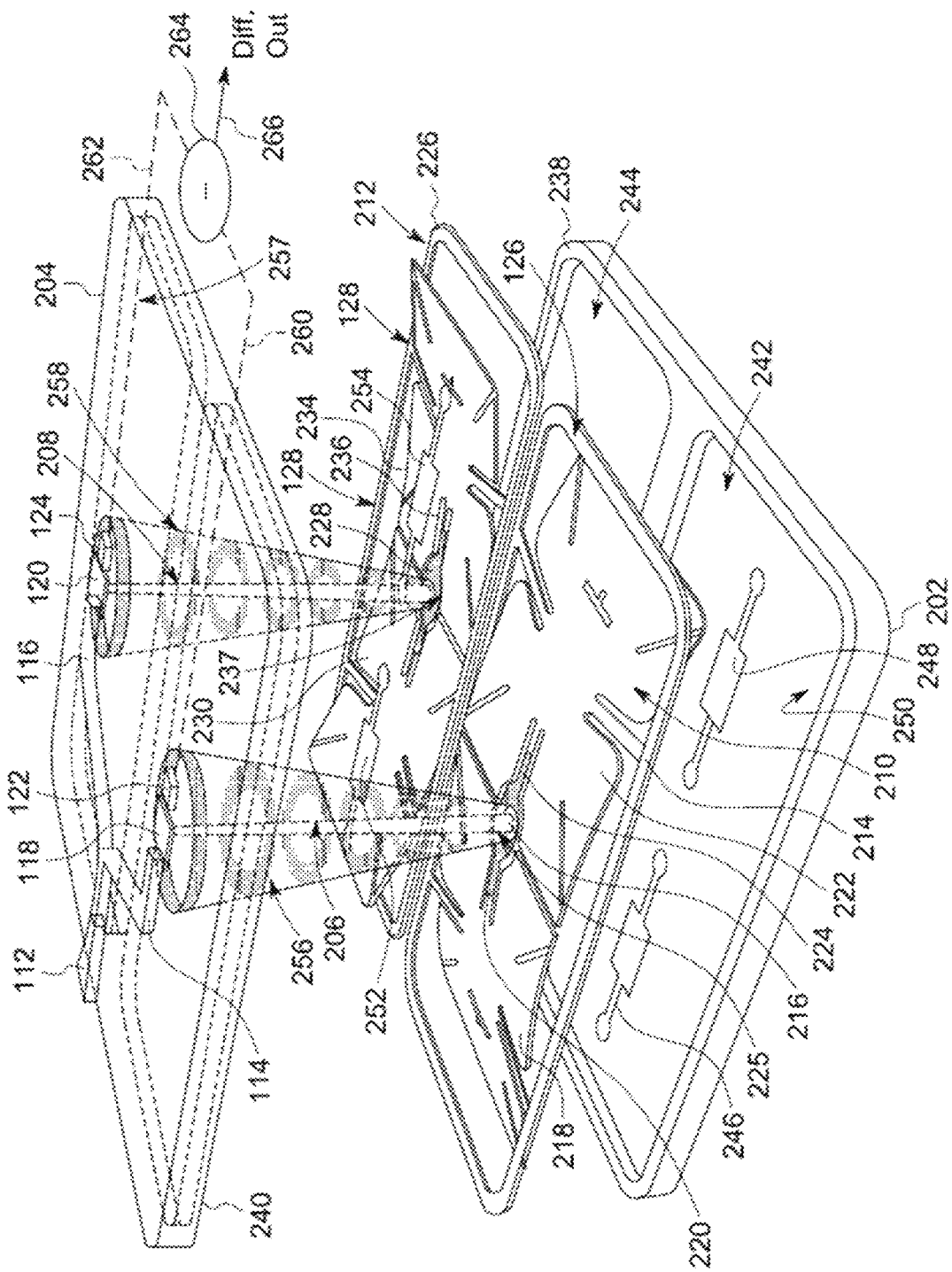
FIG. 2 is an exploded view of an exemplary resonator pair of the resonant opto-mechanical accelerometer shown in FIG. 1.

FIG. 2 is an exploded view of first resonator 126 and second resonator 128. As shown, first resonator 126 and second resonator 128 are substantially identical. In addition, first resonator 126 and second resonator 128 are mounted between a substrate 202 and a cover 204. Substrate 202 and cover 204 are manufactured as micro-electro-mechanical systems ("MEMS") wafers, such as silicon-on-insulator ("SOI") wafers. For example, substrate 202 and cover 204 may be manufactured as SOI wafers and/or as floated borosilicate glass (e.g., PYREX) wafers. In the exemplary embodiment, substrate 202 is manufactured as an SOI wafer, and cover 204 is manufactured as a PYREX wafer.

However, in various embodiments, cover 204 is manufactured as an SOI wafer and is not substantially absorptive to light, such as light having a wavelength of approximately 1300 nanometers. As a result, cover 204 transmits and reflects light, such that one or more excitation signals, such as, for example, a first light beam 206 and a second light beam 208, are able to pass through cover 204. For example, light at a wavelength of 1300 nanometers may be 20% reflected by cover 204 and 80% transmitted. Thus, cover 204 may absorb some light, but in some embodiments, the absorption should be minimal. For example, in some embodiments, the absorption is less than 10%. If it is desired to make cover 204 from a transparent material, such as glass, such that cover 204 does not reflect a substantial amount of light, a separate thin film layer (not shown) may be deposited on cover 204 to obtain the desired reflectance. For example, a layer of $Ta_2O_5$ having a thickness between 100 and 250 nanometers can be deposited onto a glass cover 204 to obtain a reflectance of approximately 20% to 25%. Accordingly, as used here, "transparent" means that light is able to be transmitted, at least partially, and with or without some attenuation through cover 204.

Excitation by light source 110 may result in amplitude self-stabilized oscillation frequencies and may improve frequency stability. In addition, optical interactions may serve to decouple conventional quality factor and gain detection trade-offs and may simplify device fabrication by facilitating uniform, large-gap, layouts as opposed to micron-sized electrode spacing within high aspect ratio etching steps. Further, the optical drive and readout features described herein may reduce or eliminate traditional error sources, such as errors introduced as a result of AC and/or DC drive signals applied to conventional electrostatic MEMS devices.

First resonator 126 includes a first proof mass 210. First proof mass 210 includes a first mounting perimeter 214, a central portion 216, a first leaf or a first portion 218, a first spring 220, a second leaf or a second portion 222, and a second spring 224. First portion 218 is coupled to central portion 216 by first spring 220, and second portion 222 is coupled to central portion 216 by second spring 224. Thus, first resonator 126 may be referred to as a "tuning fork" or "butterfly pattern" resonator. In some embodiments, first resonator 126 may also be a multiple beam opto-mechanical resonator that uses an out-of-plane linear vibrational oscillation. More generally, first resonator 126 may include any suitable resonator geometry or form factor. Central portion 216 may include a first reflective and absorptive surface or coating 225, which may be deposited on the surface of first resonator 126 that is closest to cover 204. If first resonator 126 is non-absorbing, first reflective coating 225 may also be deposited the surface of first resonator 126 that is furthest from the cover 204. However, in various embodiments, first reflective coating 225 cannot be a perfect reflector, and must permit some portion of first light beam 206 to be absorbed by either the coating or the central portion 216.

Likewise, second resonator 128 includes a second proof mass 212. Second proof mass 212 includes a first mounting perimeter 226, a central portion 228, a first leaf or a first portion 230, a first spring 232, a second leaf or a second portion 234, and a second spring 236. First portion 230 is coupled to central portion 228 by first spring 232, and second portion 234 is coupled to central portion 228 by second spring 236. Thus, second resonator 128 may be referred to as a "tuning fork" or "butterfly pattern" resonator. Central portion 228 may include a second reflective surface or coating 237, which may be deposited on the surface of second resonator 128 that is closest to cover 204. If second resonator 128 is non-absorbing, second reflective coating 237 may also be deposited on the surface of second resonator 128 that is furthest from cover 204. However, in some embodiments, second reflective coating 237 cannot be a perfect reflector, and must permit some portion of second light beam 208 shining upon its surface to pass into central portion 228 for absorption.

During manufacturing, first proof mass 210 and second proof mass 212 are bonded or mounted between substrate 202 and cover 204. Specifically, first mounting perimeter 214 of first proof mass 210 is bonded or mounted between a substrate mounting surface 238 of substrate 202 and a cover mounting surface 240 of cover 204, such that first proof mass 210 is suspended between substrate 202 and cover 204 within a first cavity 242 defined between substrate 202 and cover 204. Similarly, first mounting perimeter 226 of second proof mass 212 is bonded or mounted between substrate mounting surface 238 of substrate 202 and cover mounting surface 240 of cover 204, such that second proof mass 212 is suspended between substrate 202 and cover 204 within a second cavity 244 defined between substrate 202 and cover 204. First cavity 242 and second cavity 244 may be sealed and filled with a gas or a mixture of gases, sealed under vacuum, and/or manufactured to include an aperture or opening (not shown) through which a gas or mixture of gases may be introduced into or evacuated from the device.

In addition, in the exemplary embodiment, a first electrode 246 and a second electrode 248 are bonded or mounted on an internal surface 250 of substrate 202, such that first electrode 246 is disposed substantially in proximity to, or under, first portion 218 of first proof mass 210, and second electrode 248 is disposed substantially in proximity to, or under, second portion 222 of first proof mass 210. In addition, a third electrode 252 and a fourth electrode 254 are bonded or mounted on an internal surface 257 of cover 204, such that third electrode 252 is disposed substantially in proximity to, or over, first portion 230 of second proof mass 212, and fourth electrode 254 is disposed substantially in proximity to, or over, second portion 234 of second proof mass 212.

In operation, and as described in greater detail below, first light beam 206 is directed by optical waveguide 112 through cover 204 onto central portion 216 of first proof mass 210, and second light beam 208 is directed by optical waveguide 112 through cover 204 onto central portion 228 of second proof mass 212. Each proof mass 210 and 212 oscillates or vibrates at a particular resonance frequency (as described in greater detail below) under the influence of an applied acceleration (or g force).

As first light beam 206 makes contact with central portion 216 of first proof mass 210, a reflected portion 256 of first light beam 206 is reflected by first reflective coating 225, and an absorbed portion of first light beam 206 is absorbed, as heat energy, by central portion 216. Reflected portion 256 is modulated at the resonance frequency of first proof mass 210 as it reflects from central portion 216 of first proof mass 210.

This modulation may be variously accomplished. For example, with respect to first resonator 126, the surfaces of cover 204 reflect some light, as does first resonator 126, such as, for example, central portion 216 of first proof mass 210. These surfaces form an optical cavity 310 having a length, L, and the reflected light from these surfaces interferes when it recombines at first photodetector 122 to cause the total reflected light intensity on first photodetector 122 to vary with the length, L, of optical cavity 310 between cover 204 and central portion 216. The variation is periodic with distance and the period is equal to half of the wavelength of light within optical cavity 310. Therefore, as resonator 126 vibrates, thereby changing the length, L, of optical cavity 310, the light intensity on photodetector 122 may also vary synchronously with the vibration of resonator 126. Other techniques may also be used to generate an oscillating light intensity on photodetector 122, such as depositing a reflective mirror (not shown) on a portion of resonator 126 that moves in and out of first light beam 206 as first resonator 126 vibrates, and/or fabricating a structure within ROMA 102 that partially shadows or prevents first light beam 206 from striking first resonator 126, where the amount of shadowing may vary as resonator 126 vibrates. These modulation techniques may be applied, in similar fashion, to second resonator 128.

Likewise, as second light beam 208 makes contact with central portion 228 of second proof mass 212, a reflected portion 258 of second light beam 208 is reflected by second reflective coating 237, and an absorbed portion of second light beam 208 is absorbed, as heat energy, by central portion 228. Reflected portion 258 is modulated to the resonance frequency of second proof mass 212 as it reflects from central portion 228 of second proof mass 212.

Thus, the frequencies associated with reflected portions 256 and 258 correspond to the resonance frequencies of first proof mass 210 and second proof mass 212, respectively, which depend upon the acceleration on ROMA 102 as well as the electromechanical stiffnesses of each proof mass 210 and 212.

As reflected portion 256 is reflected back through cover 204, reflected portion 256 is received by first photodetector 122. Similarly, as reflected portion 258 is reflected back through cover 204, reflected portion 258 is received by second photodetector 124. In response, first photodetector 122 generates a first electrical output signal 260 proportional to the frequency of received reflected portion 256, and second photodetector 124 generates a second electrical output signal 262 proportional to the frequency of received reflected portion 258.

First electrical output signal 260 and second electrical output signal 262 are transmitted (e.g., over one or more electrical wires) to an electrical circuit 264, such as a frequency counter or phase-locked-loop ("PLL"), that is configured to analyze first electrical output signal 260 and second electrical output signal 262, and, based upon the analysis, to output either digital or analog signals that are related to the oscillation frequency of resonators 126 and 128 and, in some embodiments, to other parameters such as the temperature of resonators 126 and 128. The digital signals from resonators 126 and 128 may in turn be subtracted from each other with either analog or digital electronics to provide an acceleration signal 266 that is representative of the acceleration measured by ROMA 102. Specifically, in the exemplary embodiment, electrical circuit 264 is configured to subtract one of first electrical output signal 260 and second electrical output signal 262 from the other. The difference between the two signals 260 and 262 corresponds to the acceleration on ROMA 102 and is provided as acceleration signal 266. Moreover, as described below, acceleration signal 266 is temperature independent.

Figure 3:
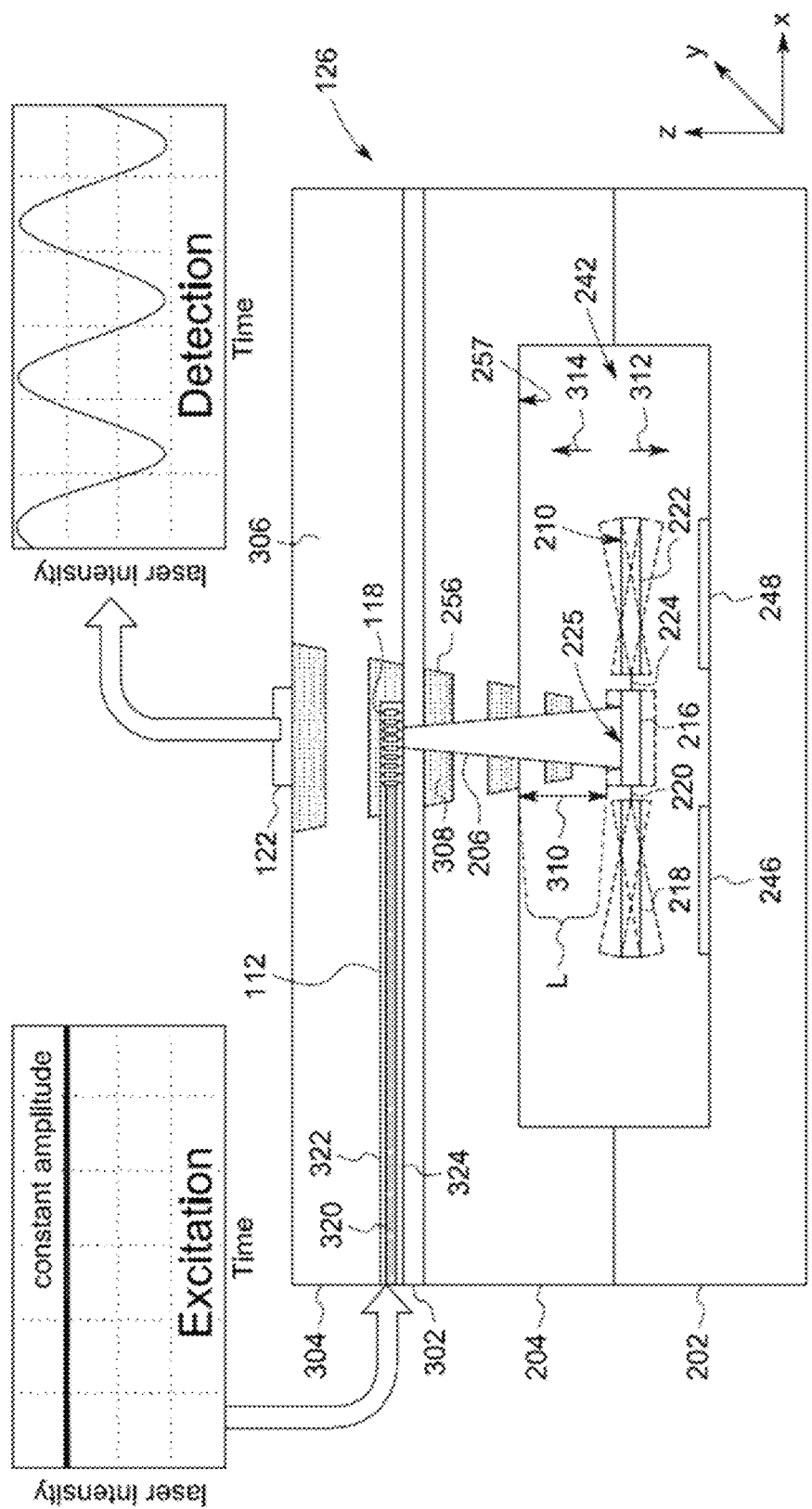
FIG. 3 is a schematic view of an exemplary resonator of the resonant opto-mechanical accelerometer shown in FIG. 1.

FIG. 3 is a schematic view of resonator 126 of ROMA 102 (shown at FIG. 1). Although resonator 126 is described with respect to FIG. 3, the same description applies to resonator 128.

Accordingly, resonator 126 includes, in addition to the elements described above, a cap 302 and a window 304. As described above, waveguide 112 terminates in first end 118

(e.g., an output coupler) that is constructed on either cap 302 or window 304. Waveguide 112 may be composed of a high refractive index core layer 320, such as a SiN or Si core layer, which may be surrounded above by a first low index layer 322 and below by a second low index layer 324. First low index layer 322 and second low index layer 324 may be manufactured from, for example, $SiO_2$. Because waveguide 112 may be directly attached to cover 204, the cladding material between core layer 320 and the cover 204 may be sufficiently thick to substantially prevent laser light leakage from core layer 320 into cover 204. For example, first low index layer 322 and second low index layer may be about 3 microns in thickness, which is generally sufficient to prevent substantial light leakage from core layer 320 into the cover 204. In addition, and in various embodiments, first photodetector 122 is mounted on an outer surface 306 of window 304.

As described above, central portion 216 of first resonator 126 may include a reflective surface coating, such as first reflective surface coating 225, on either or both surfaces to partially reflect light towards photodetector 122, thus forming optical cavity 310 for the purpose of generating modulated light intensity. In various embodiments, the reflected light intensity should be about 20%, but, in at least some embodiments, is preferably less than 50%. Moreover, the reflective coating, such as first reflective coating 225, should not absorb a significant amount of the laser light. For example, the absorption should be less than 5% in some embodiments, and, in other embodiments, is preferably much less than 1%.

In the exemplary embodiment, optical cavity 310 is a Fabry-Perot cavity and is configured to produce a standing light wave interference absorption and reflection pattern to allow for optical self-oscillation and detection by using only a single constant power light source (e.g., light source 110) As described previously, the reflectance of optical cavity 310 varies with the length, L, of optical cavity 310 between central portion 216 of first resonator 126 and cover 204, and this generates an optical signal that is measured by photodetector 122. For instance, when the reflected light intensity is large, then the amount of light absorbed in first resonator 126 (and/or a thin film on first resonator 126), is small, and vice-versa. Therefore, as first resonator 126 vibrates, the amount of light that it is absorbed is also oscillating synchronously. The absorbed light heats central portion 216 of first resonator 126 and can cause its mechanical properties to vary (as described in greater detail below).

For example, Young's modulus may be applied to describe the amount of strain in first resonator 126 as a function of applied stress. Specifically, the modulus may vary with temperature and, hence, with the vibration of first resonator 126. Variation in Young's modulus changes the stiffness of the first spring 220 and second spring 224, which directly affects the resonance frequency of first resonator 126. The dimensions of first resonator 126 may also vary due to the coefficient of thermal expansion of first resonator 126. For example, heating first resonator 126 will cause it to expand, which will in turn cause it to bend and change the length, L, of optical cavity 310. With a properly designed ROMA 102, when first resonator 1026 is located at a positon of high absorption, the absorbed light heats first resonator 126 and causes it to move to a location of lower absorption by changing the length, L, of optical cavity 310. With less absorbed light, first resonator 126 then cools down slightly and moves back into a position of larger absorption. The process repeats itself, causing first resonator 126 to oscillate at its natural frequency.

For example, as first spring 220 and second spring 224 increase in temperature, first portion 218 and second portion 222 may experience increased mechanical displacement about the z-axis as a result of acceleration of ROMA 102, because the stiffness of first spring 220 and second spring 224 have decreased. Conversely, as first spring 220 and second spring 224 decrease in temperature, first portion 218 and second portion 222 may experience decreased mechanical displacement about the z-axis as a result of acceleration of ROMA 102, because the stiffness of first spring 220 and second spring 224 have increased. Thus, as the temperature of resonator 126 varies, first proof mass 210 and second proof mass 212 may oscillate about the z-axis with increasing and/or decreasing resonance frequency.

In the exemplary embodiment, a first voltage may be applied to first electrode 246, and a second voltage may be applied to second electrode 248, to compensate for the change in temperature and/or to adjust the resonance frequency of first proof mass 210. For example, as the voltage generated by first electrode 246 is adjusted, the electrostatic force between first electrode 246 and first portion 218 of first proof mass 210 may vary, such that the electromechanical stiffness of first portion 218, which is suspended from central portion 216 by spring 220, increases and decreases with corresponding increases and decreases in voltage. Similarly, as the voltage generated by second electrode 248 is adjusted, the electrostatic force between second electrode 248 and second portion 222 of first proof mass 210 may vary, such that the electromechanical stiffness of second portion 222, which is suspended from central portion 216 by spring 224, increases and decreases with corresponding increases and decreases in voltage.

These changes in electromechanical stiffness affect the resonance frequency of first proof mass 210 during operation. For example, as the electromechanical stiffness of first proof mass 210 increases, the resonance frequency of first proof mass 210 may also increase, and as the electromechanical stiffness of first proof mass 210 decreases, the resonance frequency of first proof mass 210 may also decrease. An increasing and/or decreasing voltage may thus be applied between first electrode 246 and/or second electrode 248 and first proof mass 210 to adjust the electromechanical stiffness of first proof mass 210 and, in turn, the resonance frequency of first proof mass 210.

In addition, as reflected portion 256 of first light beam 206 reflects from central portion 216, reflected portion 256 travels along the z-axis within optical cavity 310 and reflects from the top and bottom surfaces of cover 204 back towards central portion 216. In other words, reflected portion 256 bounces back and forth between central portion 216 and the surfaces of the cover within optical cavity 310. Some of this reflected light escapes optical cavity 310 (as reflected portion 256) and travels along the z-axis towards photodetector 122, where it is converted, as described above, into first electrical output signal 260, which is proportional to the resonance frequency of resonator 126.

Thus, ROMA 102 detects acceleration based, in part, upon the frequency of reflected portion 256 of first light beam 206. As described above, however, the same resonation and detection processes occur within resonator 128, where second photodetector 124 converts reflected portion 258 of second light beam 208 into second electrical output signal 262.

More particularly, in the exemplary embodiment, first electrode 246 of first resonator 126 applies a bias voltage under first portion 218 of first proof mass 210, and second electrode 248 of first resonator 126 applies a bias voltage under second portion 222 of first proof mass 210. These bias voltages may, for example, increase the electromechanical stiffness of first proof mass 210 in a first direction 312 along the z-axis (because first proof mass 210 is attracted and/or repulsed by the electrostatic force developed as a result of the bias voltages), such that first proof mass 210 oscillates at a first resonance frequency in response to an acceleration in either first direction 312 or second direction 314.

Similarly, third electrode 252 of second resonator 128 applies a bias voltage over first portion 230 of second proof mass 212, and fourth electrode 254 of second resonator 128 applies a bias voltage over second portion 234 of second proof mass 212. These bias voltages may, for example, increase the electromechanical stiffness of second proof mass 212 in a second direction 314 along the z-axis (because second proof mass 212 is attracted and/or repulsed by the electrostatic force developed as a result of the bias voltages), such that second proof mass 212 oscillates at a second resonance frequency in response to an acceleration in either first direction 312 or second direction 314.

As a result of these opposing bias voltages, ROMA 102 may operate such that, as the resonance frequency of first resonator 126 increases, the resonance frequency of second resonator 128 decreases (and vice versa). Moreover, if the bias voltages applied to each resonator 126 and 128 are substantially equivalent, the difference between the first resonance frequency of first proof mass 210 and the second resonance frequency of second proof mass 212 will correspond to the actual acceleration upon ROMA 102. For example, differential output signal 266 will not be affected by the temperature of ROMA 102, because the variations in the first resonance frequency and the second resonance frequency arising as a result of temperature fluctuations will cancel in the difference calculation performed by electrical circuit 264 (as described above). ROMA 102 is thus capable of detecting acceleration independent of temperature.

As the acceleration on ROMA 102 varies during operation, it may be desirable to increase and/or decrease a scale factor associated with one or both of first resonator 126 and second resonator 128 to improve the dynamic range of ROMA 102. For example, as the acceleration on ROMA 102 increases, it may be desirable to increase and/or decrease the scale factor associated with one or both of first resonator 126 and/or second resonator 128. Similarly, as the acceleration on ROMA 102 decreases, it may be desirable to increase and/or decrease the scale factor associated with one or both of first resonator 126 and second resonator 128.

To adjust the scale factor, the bias voltages generated by one or more of first electrode 246, second electrode 248, third electrode 252, and/or fourth electrode 254 may be increased and/or decreased. For example, at large accelerations, the resonance frequencies of first resonator 126 and second resonator 128 may fluctuate rapidly. To accommodate for this frequency instability, one or more electrodes 246, 248, 252, and/or 254 may be controlled (e.g., by controller 108) to increase and/or decrease the bias voltage applied to first proof mass 210 and/or second proof mass 212. For example, as the bias voltage is increased, the resonance frequency of each proof mass 210 and 212 may also increase. Thus, the resonance frequencies of first proof mass 210 and second proof mass 212 may be scaled up and down to accommodate increases and decreases in acceleration. In some embodiments, ROMA 102 may detect g forces ranging from 0 g to 50,000 g.

First resonator 126 and/or second resonator 128 may also be dynamically balanced as part of an initial calibration function and/or during operation. More particularly, first portion 218 of first proof mass 210 and second portion 222 of first proof mass 210 may vary slightly in mass (e.g., due to imperfections in the manufacturing process). Similarly, first portion 230 of second proof mass 212 and second portion 234 of second proof mass 212 may vary slightly in mass. These small deviations in mass may unbalance first proof mass 210 and second proof mass 212, such that the resonance frequencies of first resonator 126 and second resonator 128 are affected.

To balance first resonator 126 and/or second resonator 128, one or more bias voltages may be applied, as described above, to either or both of first proof mass 210 and/or second proof mass 212. In particular, first electrode 246 and second electrode 248 may apply one or more bias voltages to first proof mass 210, and third electrode 252 and fourth electrode 254 may apply one or more bias voltages to second proof mass 212.

In another embodiment, vibrating MEMS may be used for measurement of acceleration in an inertial sensor device. These devices include a thin vibrating silicon membrane suspended in vacuum inside a small container made of silicon, glass, or other materials. The oscillation of the membrane is achieved via laser light. A constant (CW) laser beam incident through the container upon the correct location of the membrane can cause the membrane to oscillate continuously, and the oscillation frequency is found to be extremely stable, to 1 ppb or better, as long as the temperature of the device is held constant. If the temperature of the sensor is varies by approximately 1° C., the device stops oscillating.

Figure 4:
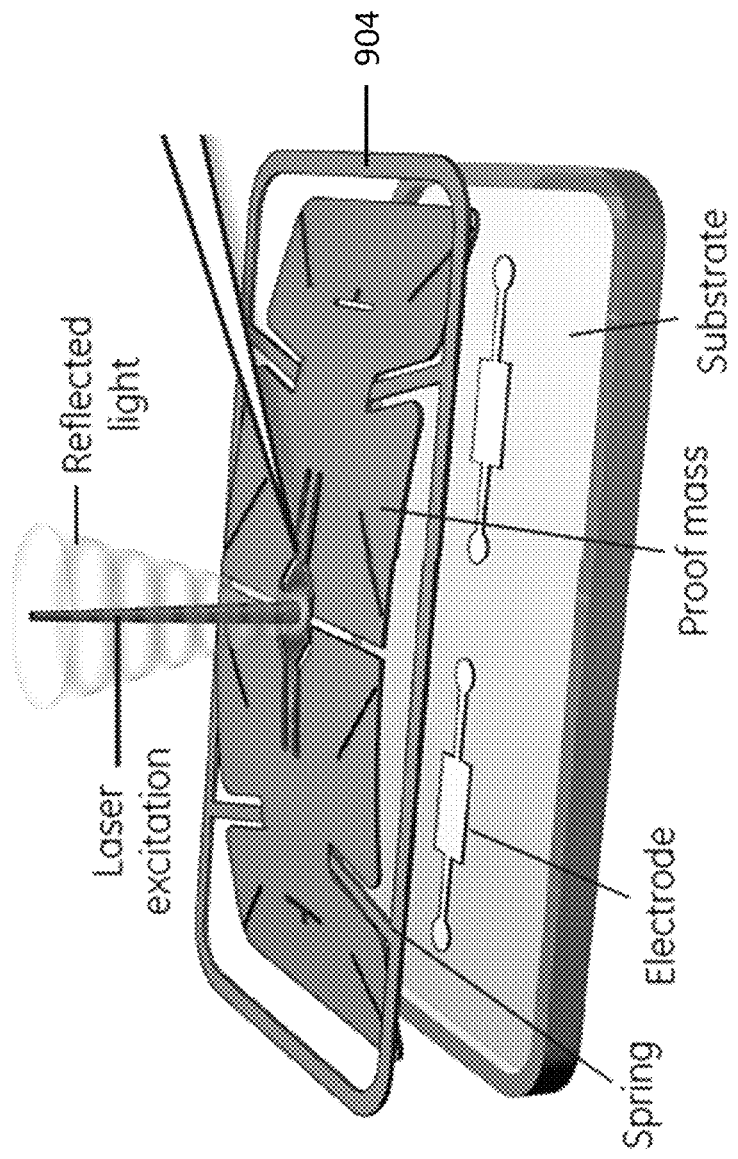
FIG. 4 illustrates and embodiment using an optical fiber.
Figure 5:
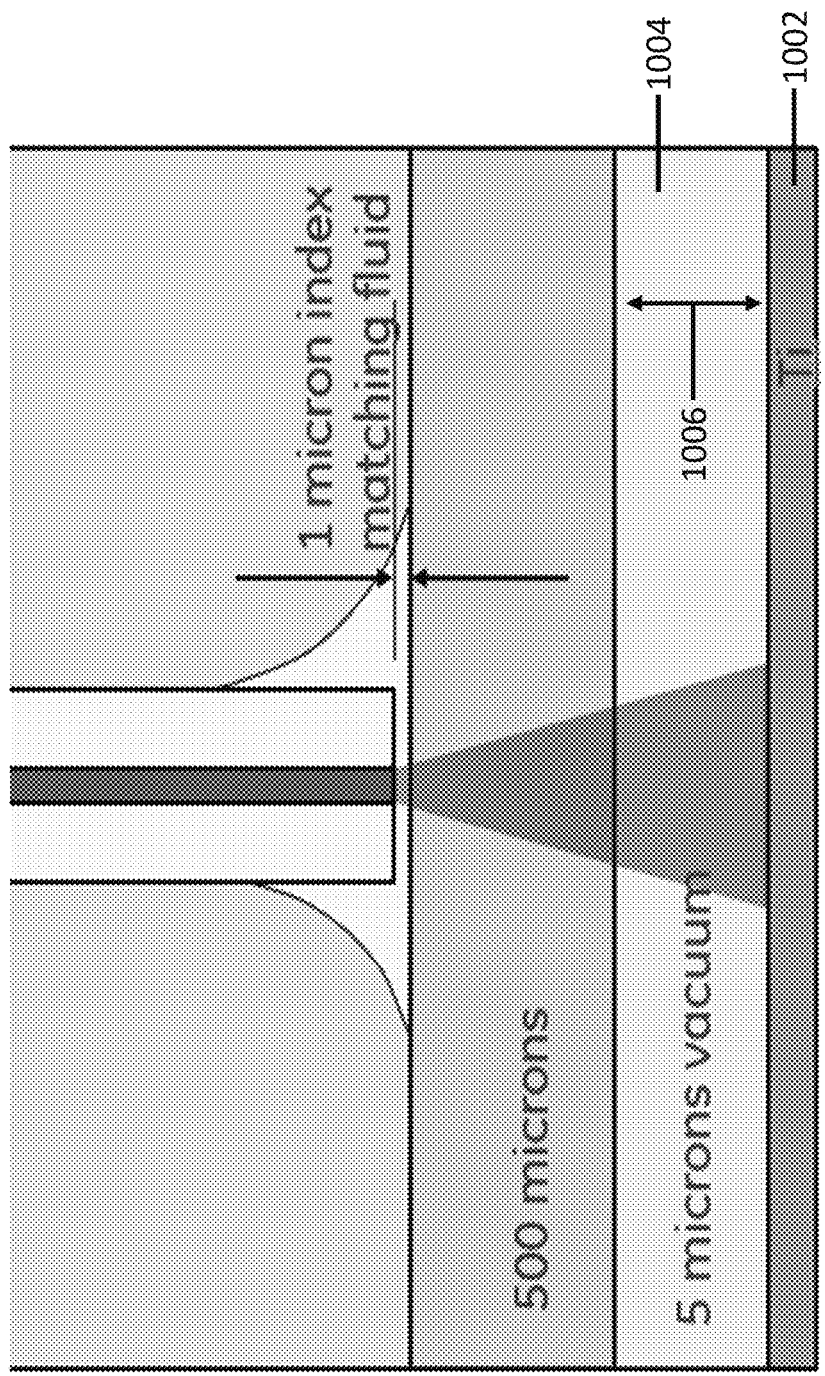
FIG. 5 illustrates an optical model of a sensor.

The resonating membrane forms an optical cavity with the cap of the device. As the temperature of the device changes, the thickness of the cap and the thickness of the gap between the cap and membrane vary. Moreover, the refractive index of the cap varies. An appropriate antireflection coating on one side of the cap can eliminate most of the effect of cap thickness and refractive index variation. Without an antireflection coating, however, the operating point 402 on the reflectivity curve 400 changes as shown in FIG. 4. If the device temperature changes sufficiently, the device reaches a region in which it can fail to oscillate. The oscillation frequency of one MEMS device is shown in FIG. 5 as device temperature was varied. The device stopped oscillating at 20.6° and 22.2° C. The measured frequency shift with device temperature was −5.35 Hz/° C.

FIG. 4 illustrates another embodiment in which laser light 902 is brought to the MEMS sensor through an optical fiber that is carefully aligned to the sensor so that the laser light 902 is absorbed and reflected from a precise position on a resonant vibrating membrane 904 within the device. The membrane is enclosed in a vacuum-sealed chamber (not shown in the figure) which may be composed of silicon, glass, or other materials, or a combination of materials. The vibrating membrane may be configured in a "butterfly" accelerometer design, with multi-axis symmetry and "wing" structures, or in any other suitable configuration. The effect of a CW laser beam is to cause the resonant membrane 904 to oscillate. The frequency stability of certain device designs can be as good as one part in $10^9$ or better.

Experimentally, when the laser light is incident upon the membrane 904 through a silicon cap, it is found that the device is extremely sensitive to temperature changes. Small changes in device temperature can cause the resonant frequency to drift, which precludes using the device for measurement of acceleration. Moreover, the device is found to be extremely sensitive to laser wavelength. For example, a device may operate well with a laser at a wavelength of 1306 nm, and refuse to operate at the same laser power but at a laser wavelength of 1311 nm.

Figure 6:
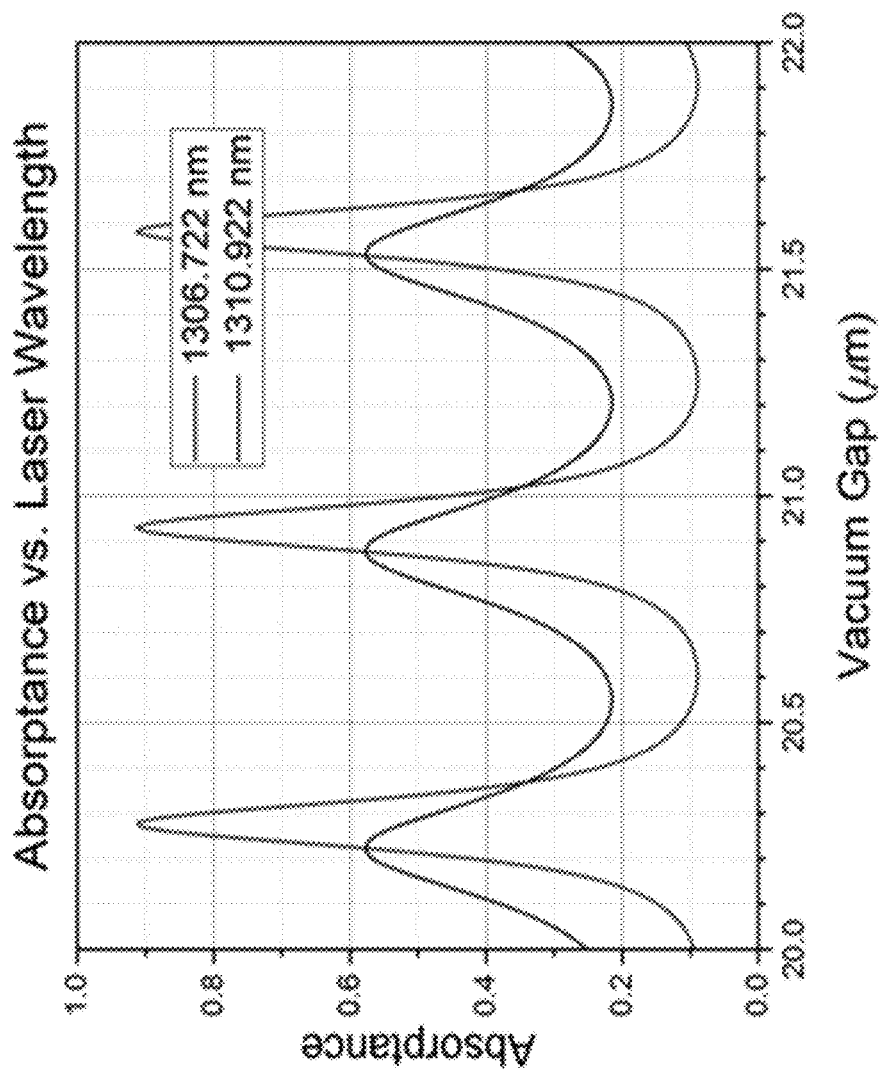
FIG. 6 illustrates absorptance as a function of vacuum gap.

FIG. 5 illustrates an optical model of the sensor. The absorptance of the metal film 1002, which drives the membrane oscillation, was calculated as a function of vacuum 1004 gap thickness 1006 (which varies as the membrane vibrates) for the two laser wavelengths as shown in FIG. 6. Titanium, tungsten and other suitable metals may be used as the metal film 1002. Even though there is <5 nm change in laser wavelength, the different absorptance profiles are significant. At 1306 nm, the finesse of the optical system (essentially a measurement of the depth of the fringes and steepness of the curves) is much larger than that at 1311 nm. It is the slope of the absorptance curve that drives the membrane oscillation—a larger slope provides greater driving force to the membrane. Therefore, the optical model indicates that the cavity finesse at 1306 nm is more likely to excite the resonant mode than that at 1311 nm. The vacuum gap 1004 may have a thickness 1006 between about 2 microns and about 80 microns. In other embodiments, the vacuum gap 1004 may have a thickness 1006 between about 3 microns and about 50 microns. In other embodiments, the vacuum gap 1004 may have a thickness 1006 between about 4 microns and about 35 microns. In other embodiments, the vacuum gap 1004 may have a thickness 1006 between about 5 microns and about 20 microns. In other embodiments, the vacuum gap 1004 may have a thickness 1006 between about 5 microns and about 15 microns. In other embodiments, the vacuum gap 1004 may have a thickness 1006 between about 5 microns and about 12 microns.

Figure 7:
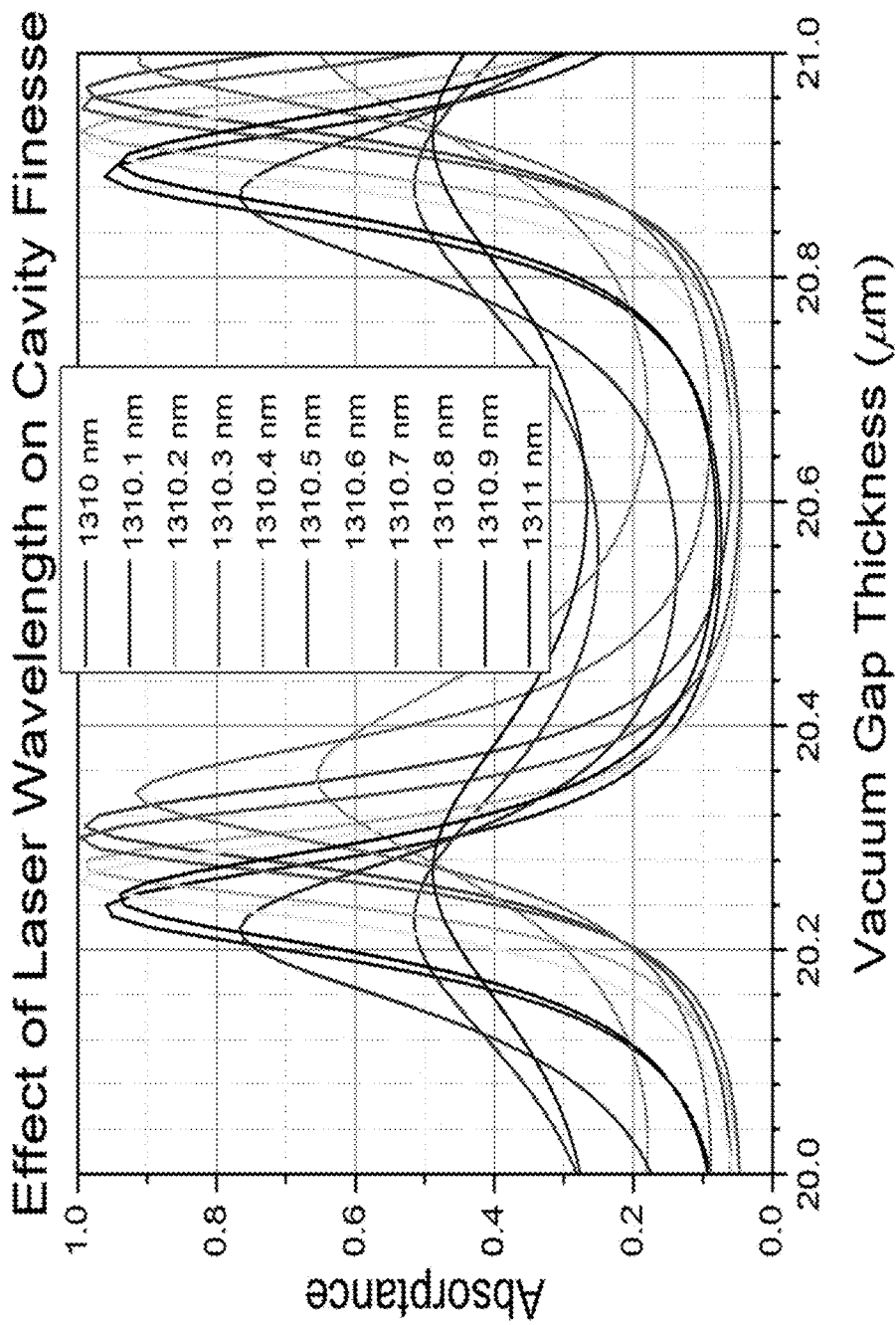
FIG. 7 illustrates vacuum gap thickness as a function of membrane vibration.

FIG. 7 illustrates the absorptance as a function of vacuum gap thickness 1006 for a Si cap at several different wavelengths. As can be seen, the finesse is low at 1310 nm, rises to a peak at about 1310.2 nm, and then drops again, reaching another minimum between 1310.4 and 1310.5 nm, and a subsequent maximum between 1310.6 and 1310.7 nm, and minimum at 1310.9 nm. The period of oscillation in laser wavelength of the finesse is thus [18] 0.45 nm.

Figure 8:
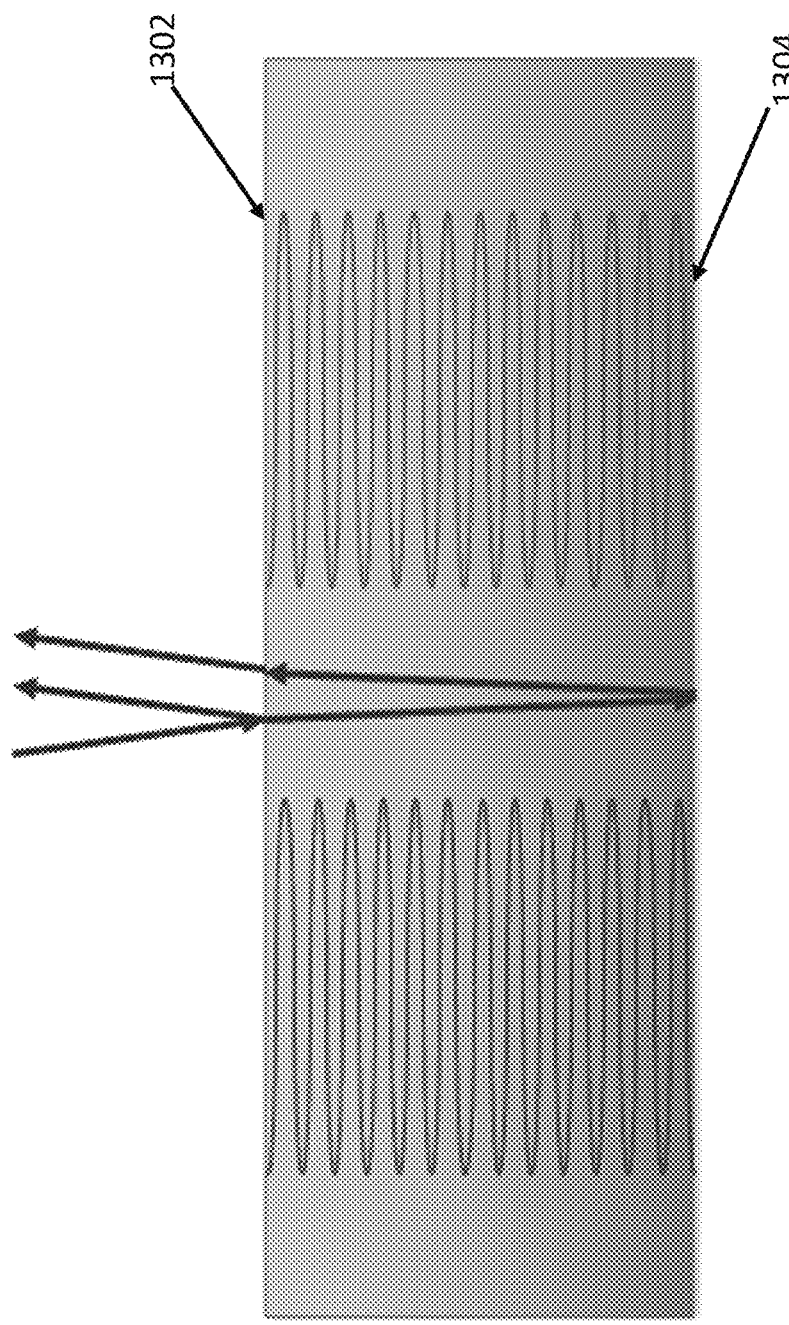
FIG. 8 illustrates the variation in absorptance with wavelength.

As illustrated in FIG. 8, the variation in absorptance with wavelength is due to the optical thickness of the Si cap, which forms an optical cavity. Laser light is reflected from both top 1302 and bottom 1304 surfaces of the Si cap as shown. For a 500 micron cap thickness with a refractive index of 3.778, the roundtrip optical thickness (physical distance multiplied by the refractive index) of the cap is 3.778 mm. This means that at a wavelength of 1310 nm, there are 2884 complete periods of the light in the round trip. Furthermore, when the wavelength changes by 0.45 nm, a similar calculation demonstrates that the number of periods in a round trip increases or decreases by 1. This explains the origin of the period in the variation in absorptance with wavelength.

In addition to the reflections that occur at surfaces 1302 and 1304, there is another reflection at the surface of the metal film on the vibrating membrane. The absorptance is, therefore, a function of reflected light from all three surfaces. Although the 0.45 nm period of the variation is determined by the thickness of the Si cap via the reflections at the top and bottom surfaces, the finesse of the cavity is strongly influenced by the reflection from the metal film. When all three reflections interfere, although the period of the variation of the absorptance with wavelength is relatively constant, the finesse of the cavity can vary substantially.

If the optical thickness of the cap changes, this will also cause the finesse of the cavity to vary due to changes in how all three reflections interfere. Optical thickness changes whenever the actual thickness and/or the optical refractive index changes. Both of these parameters can vary with changes in device temperature. The coefficient of thermal expansion for Si is $2.6 \times 10^{-6}$ $K^{-1}$. The thermo-optic coefficient of Si is ~$1.8 \times 10^{-4}$ $K^{-1}$. Therefore, a temperature change of the Si cap by ~7° C. is sufficient to make one period variation in the absorptance of the cavity. As the temperature changes, the finesse of the optical cavity also changes in a manner similar to that shown in FIG. 7. A 3.5° C. change in cap temperature will have the same effect as a 0.23 nm change in laser wavelength, so that the finesse of the cavity can change from its maximum value to its minimum value, potentially causing the device to shift from a self-oscillating state to a state which does not oscillate. Not only will there potentially be a shift to a non-oscillating state, but the change in cavity finesse also means that there is a change in amount of laser power that is absorbed by the membrane. Therefore, the average membrane temperature during oscillation is changing, which in turn means that the oscillation frequency of the membrane is changing. This generates a spurious signal that can mask or interfere with determining the acceleration of the device from its resonant frequency of oscillation.

Figure 9:
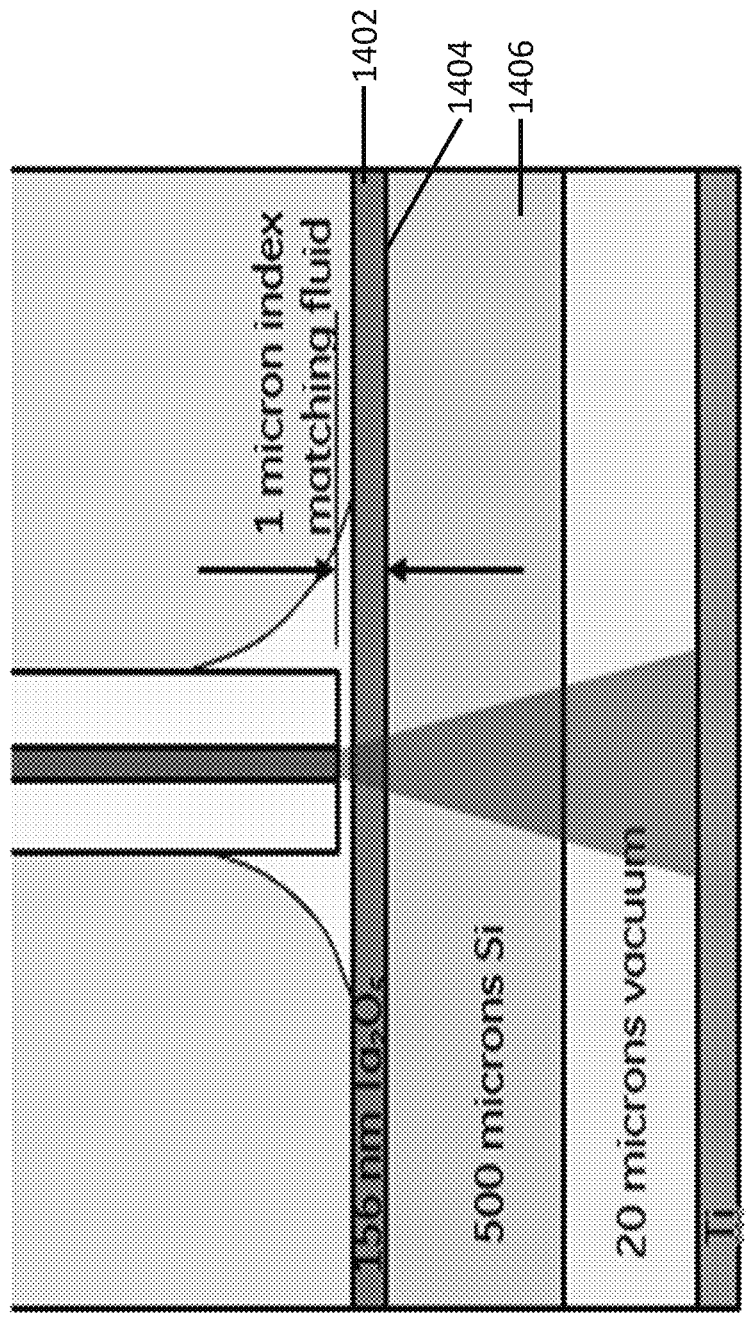
FIG. 9 illustrates an embodiment of an optical accelerometer.

In order to eliminate this sensitivity to laser wavelength or device temperature, the reflection from one surface 1404 of the cap 1406 must be suppressed. One way to do this is to put an anti-reflection coating 1402 on one of the surfaces of the cap 1406. A single layer anti-reflection (AR) coating 1402 is typically composed of a material that has an index of refraction intermediate between the two materials on either side of it, and an optical thickness that is a quarter wavelength. For example, if a 156 nm tantala ($Ta_2O_5$, e.g.) thin film 1402 with a refractive index of 2.1 is deposited onto the outer surface 1404 of the Si cap 1406 as shown in FIG. 9, the reflectance from this surface 1404 drops to about 1% at a wavelength of 1310 nm. In other embodiments, the reflectance from this surface 1404 drops to about 10% or less. In other embodiments, the reflectance from this surface 1404 drops to about 5% or less. In other embodiments, the reflectance from this surface 1404 drops to about 0.5% or less. In other embodiments, the reflectance from this surface 1404 drops to about 0.2% or less. However, without this tantala film, the reflectance is greater than 30%. The thin film 1402 may also be composed of other dielectric (non-metallic/non-absorbing) and/or non-metallic materials and may include a thickness from about 20 nm to about 500 nm. In other embodiments, the thin film 1402 may be from about 50 nm to about 400 nm thick. In other embodiments, the thin film 1402 may be from about 75 nm to about 300 nm thick. In other embodiments, the thin film 1402 may be from about 100 nm to about 200 nm thick. In other embodiments, the thin film 1402 may be from about 125 nm to about 175 nm thick. The thin film 1402 may have a refractive index between about 1.3 and about 5. In other embodiments, the thin film 1402 may have a refractive index between about 1.5 and about 4. In other embodiments, the thin film 1402 may have a refractive index between about 1.75 and about 3. In other embodiments, the thin film 1402 may have a refractive index between about 1.9 and about 2.6. In other embodiments, the thin film 1402 may have a refractive index between about 2.1 and about 2.4. Even better antireflection coatings can be fabricated by including more dielectric layers. For example, a common antireflection film is composed of three thin film layers in which there is a high index material, a low index material, and an intermediate index material. For example, an approach for designing antireflection layers is described in Applied Optics vol. 27 (1988) 2320-2333.

Figure 10:
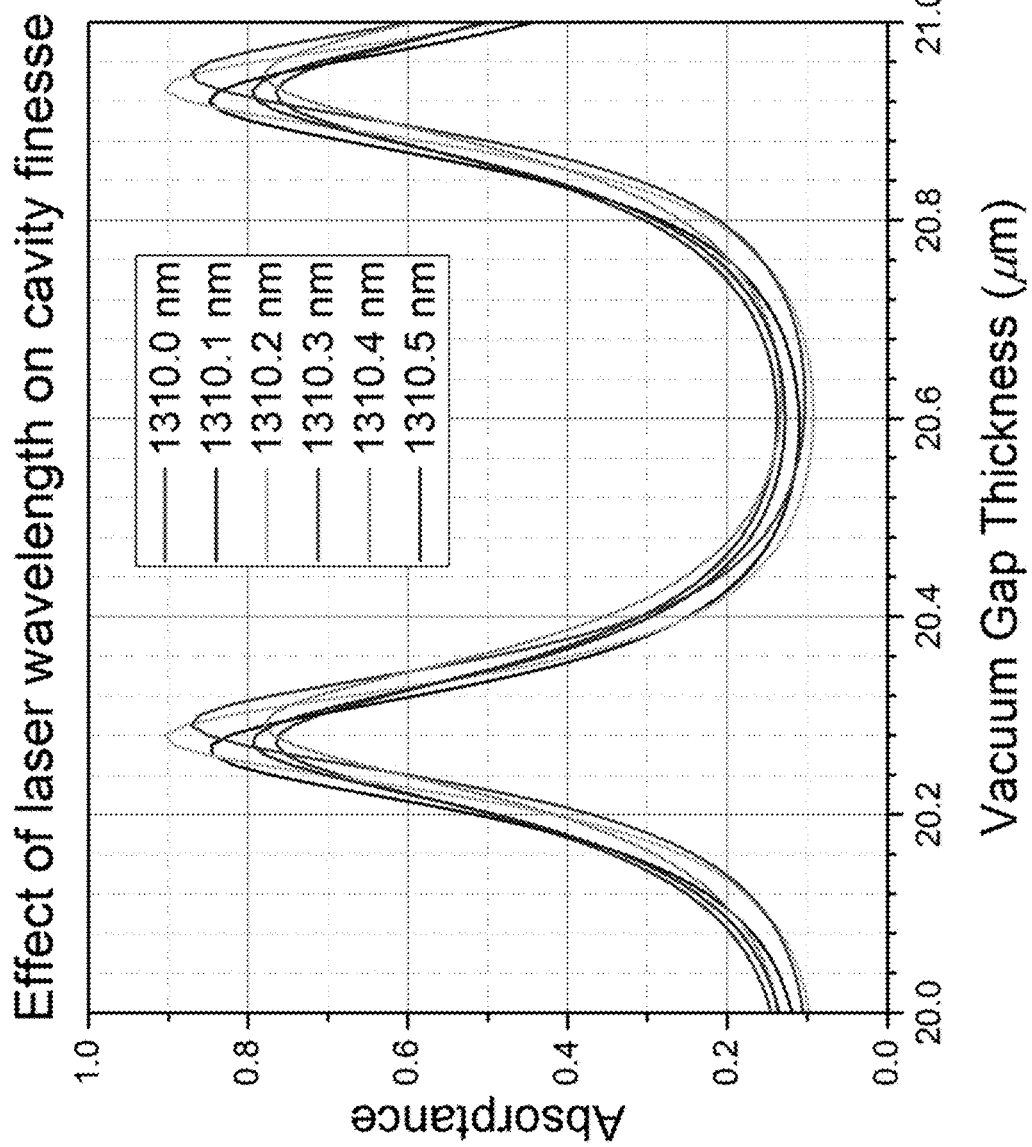
FIG. 10 illustrates the reflectance of the cap with a thin tantala film.

FIG. 10 illustrates the absorptance calculated as a function of the vacuum gap thickness at different wavelengths (similar to FIG. 7) when a single layer anti-reflection coasting is applied to the top surface of the Si cap. The variation in absorptance/cavity finesse with laser wavelength has been greatly reduced compared to that in FIG. 7. The cavity finesse, however, is not as large as the finesse for the bare Si at its optimal wavelength. Further reduction in wavelength-dependence is possible by using a multilayer AR coating on the outside surface of the Si cap. Further increase in cavity finesse is possible by using a dielectric thin film reflector on the inside surface of the Si cap. An AR-coating on the inside surface of the Si cap and a dielectric reflector on the outside surface of the cap would also work to reduce the sensitivity of the device to temperature and laser wavelength, and increase the cavity finesse, respectively, but this is not as desirable as the first option because the greater optical distance between the outer Si cap surface and the membrane leads to larger secondary effects from thermal expansion of the Si cap.

Figure 11:
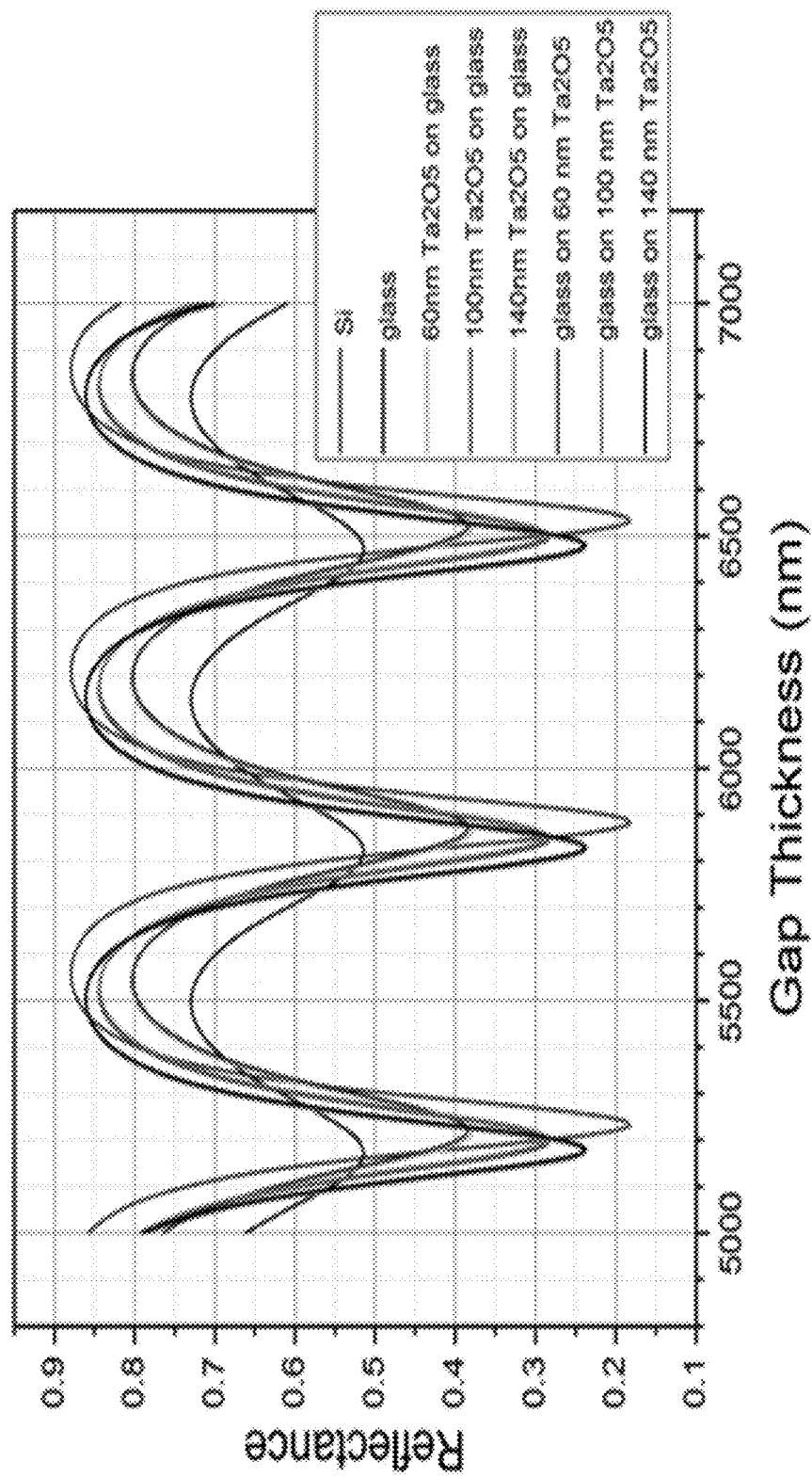
FIG. 11 illustrates the cavity finesse calculated at different wavelengths.

Although it is generally better to fabricate the entire device from the same material, i.e., silicon, to eliminate strain in the device arising from different coefficients of thermal expansion between different materials, it is possible to replace the silicon cap with glass for use over a more limited temperature range. Calculations of the cavity finesse for a silicon cap, a glass cap, and a glass cap with a single thin film reflector layer are shown in FIG. 11. As can be seen, neither the bare glass nor the glass with a single reflector layer performs as well as (i.e., has as large a finesse as) the bare silicon. The bare glass performs particularly poorly.

Figure 12:
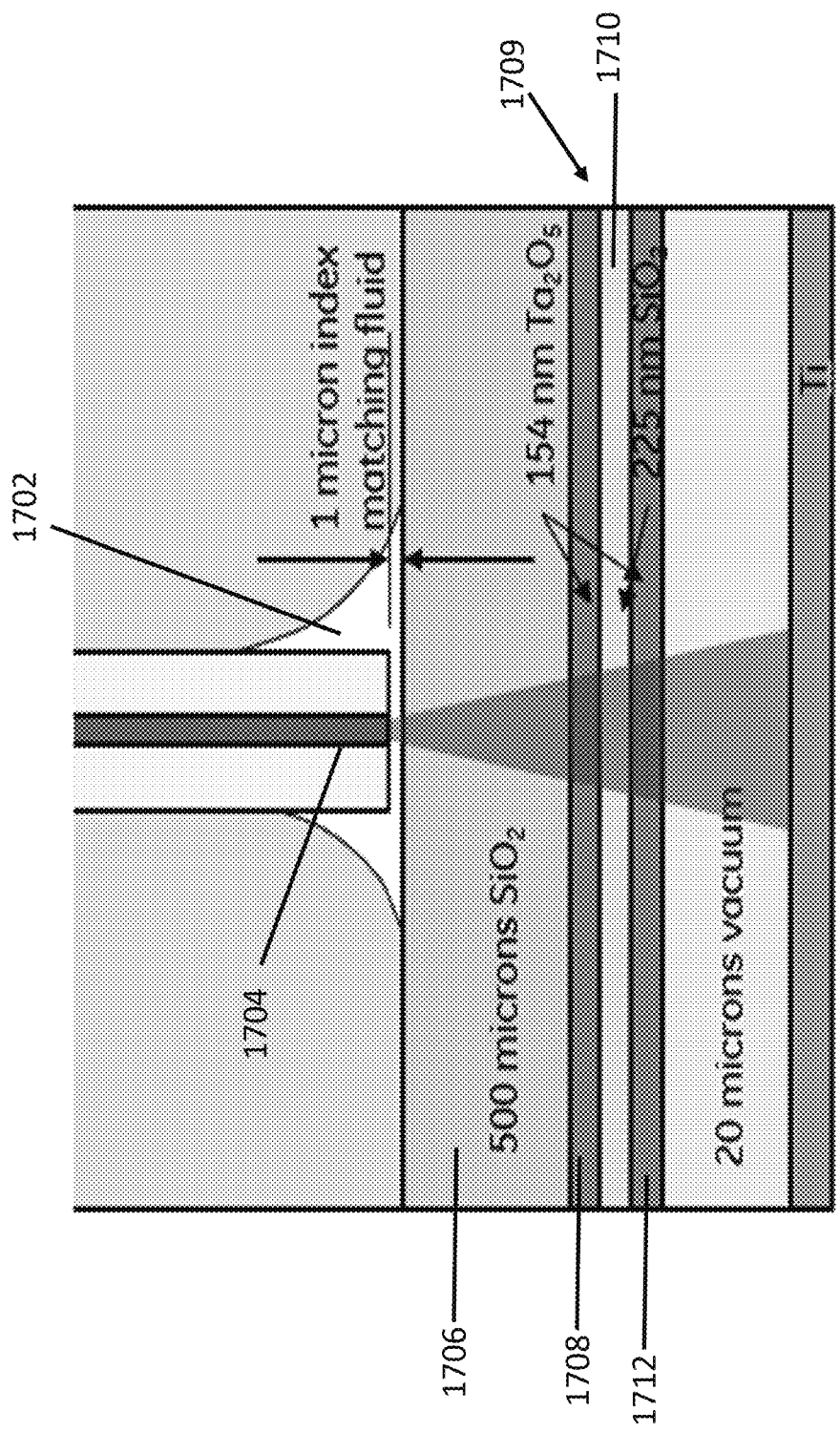
FIG. 12 illustrates an embodiment of an optical accelerometer.
Figure 13:
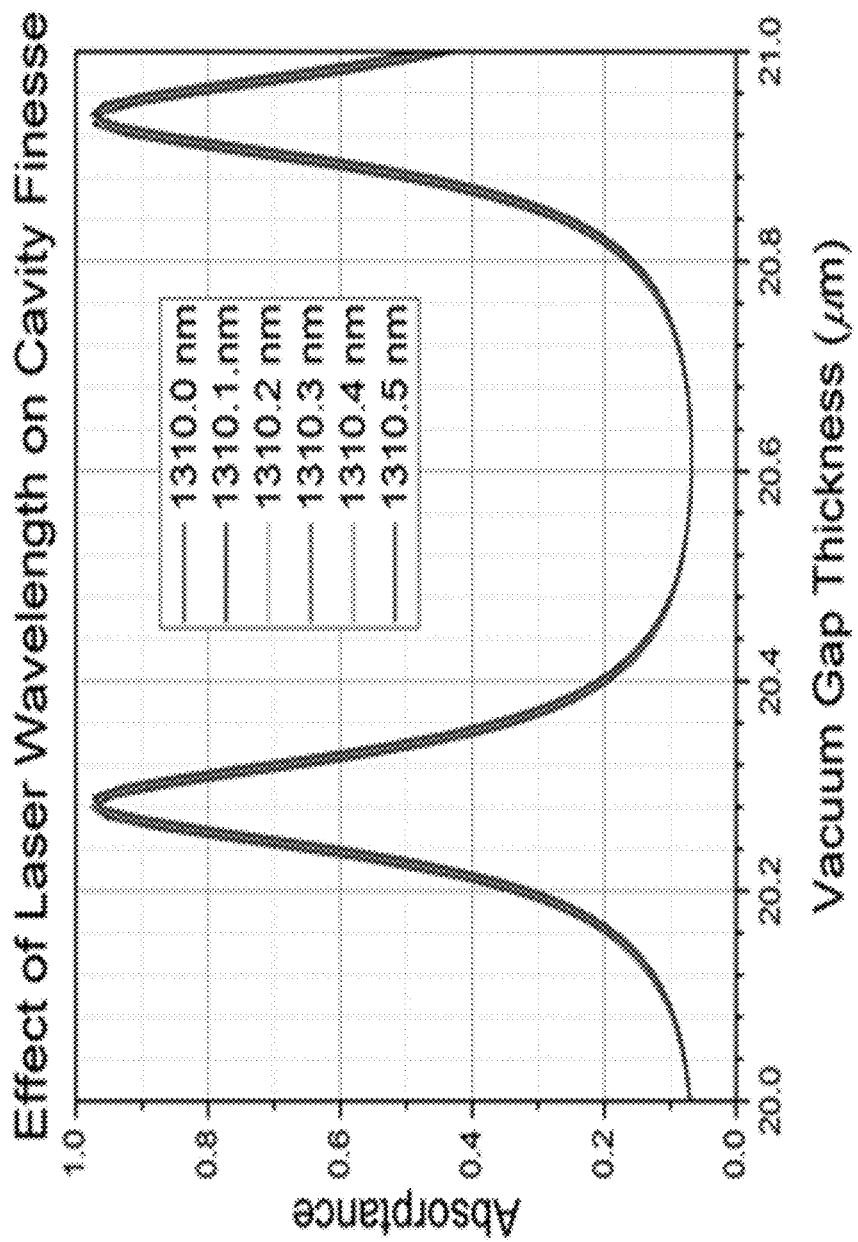
FIG. 13 illustrates the performance of a three-layer reflecting quarter-wave film stack.

In another embodiment shown in FIG. 12, a three-layer reflecting quarter-wave film stack 1709 on the inside surface of the glass cap performs much better than a bare silicon cap at its optimum wavelength. FIG. 13. illustrates the cavity finesse calculated at different wavelengths for the three-layer configuration illustrated in FIG. 12, demonstrating larger finesse and almost no wavelength dependence. The index matching fluid 1702 between the optical fiber 1704 and glass cap 1706 entirely eliminates reflections from the top surface of the cap in this model. The three-layer film stack 1709 illustrated in FIG. 12 may include a reflectivity (or reflectance) between about 20% and about 80%. In other embodiments, the three-layer film stack illustrated in FIG. 12 may include a reflectivity (or reflectance) between about 30% and about 70%. In other embodiments, the three-layer film stack illustrated in FIG. 12 may include a reflectivity (or reflectance) between about 45% and about 65%. In other embodiments, the three-layer film stack illustrated in FIG. 12 may include a reflectivity (or reflectance) between about 50% and about 60%.

The transparent cap 1706, according to the present claimed embodiments and figures may include at least one of the following materials: silica, borosilicate glass, silicon, SiO2, and boron trioxide, as well as other suitable materials having low coefficients of thermal expansion. For example, the transparent cap 1706, 1902 may be composed of suitable materials having a coefficient of thermal expansion of about $5 \times 10^{-6}$ K$^{-1}$ at 20° C. and lower. The film 1402, 1702, 1904 of the present claimed embodiments may include at least one of tantala, MgF2, SiN, TaOx, HfOx, and YOx, as well as other suitable high refractive index materials.

The three-layer reflecting quarter-wave film stack 1709 illustrated in FIG. 12 may include materials such that a first layer 1708 has a high refractive index, a second 1710 has a low refractive index, and third layer 1712 has a high refractive index materials, respectively such that the middle layer is composed of a lower refractive index material and both the top and bottom layers are composed of a high refractive index material. Each of the first, second, and third layers 1708, 1710, 1712 may have a thickness between about 50 nm and about 500 nm. In other embodiments, each of the first, second, and third layers 1708, 1710, 1712 may have a thickness between about 100 nm and about 300 nm. In other embodiments, each of the first, second, and third layers 1708, 1710, 1712 may have a thickness between about 125 nm and about 250 nm. Examples of high refractive index materials include Ta2O5 and TiO2. Examples of low refractive index materials include SiOx and SiO2. Examples of medium refractive index materials include SiON, SiN and HfO2. The thin film 1402 in the embodiment of FIG. 9 may similarly include each of a low, medium, and high refractive index layers in embodiments that include multiple layers. The antireflecting film 1402 of FIG. 9 may include an intermediate refractive index in embodiments that include a single layer.

Figure 14:
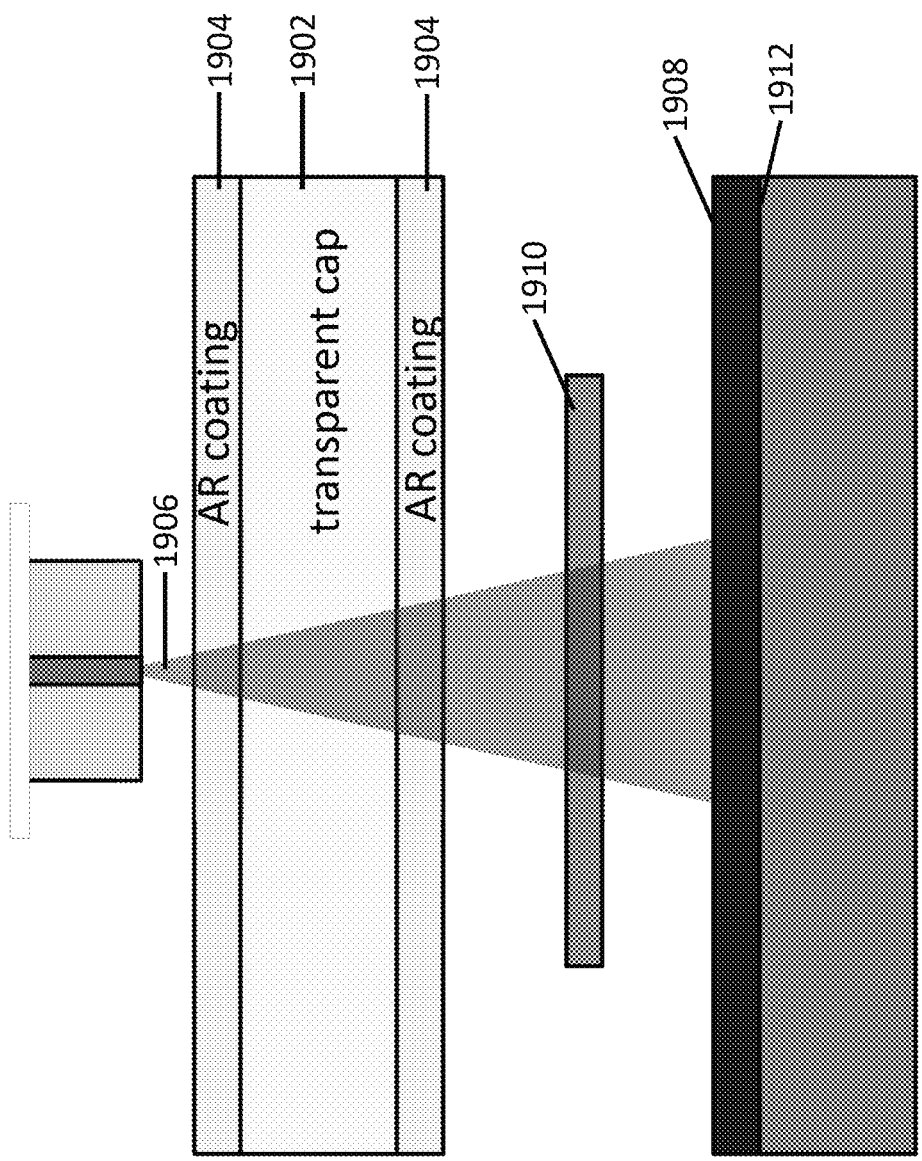
FIG. 14 an embodiment of an optical accelerometer, according to aspects of the present embodiments.

In another embodiment shown in FIG. 14, a transparent cap 1902 has an AR-coating 1904 on both sides so that it is completely transparent to the incident laser light 1906 and therefore does not form a part of the optical cavity. On the bottom behind (and/or beneath) the resonating membrane 1910 is a mirror or reflector 1908 (i.e., reflecting layer and/or reflecting surface). The reflecting layer 1908 is disposed on an opposite side of the membrane 1910 than the transparent cap 1902. The membrane 1910 itself now is partially transparent, whereas in the previous implementation it was opaque—it did not transmit any light. In this new implementation, the optical cavity is formed between the membrane 1910 and a bottom reflector 1912, rather than between the top cap 1902 and the membrane 1910. As such, the embodiment of FIG. 14 includes at least one bottom reflecting surface disposed on an opposite of the membrane from the transparent cap 1902.

In the embodiments described herein, variations in gap thickness due to temperature variations may be overcome by varying laser temperature, laser current and/or laser power. Such embodiments result in the accurate sensing of acceleration through a wide environmental temperature range. Such embodiments are useful in applications where sensing acceleration is desired such as in vehicles including planes, bikes, cars, trains, boats, rockets; personal electronics including smart phones, tablets, wearable fitness devices, portable music players, headsets, communication devices, fitness trackers, watches, drones, and other applications that include moving components. In other embodiments described herein, reducing or eliminating a top reflection while utilizing materials with substantially equal refractive indices may mitigate errors and sensor biases introduced as a result of environmental temperature variation. These embodiments are useful in a wide variety of applications, as discussed above.

Embodiments of the resonant opto-mechanical accelerometer thus include a light source, such as a laser, a first resonator, and a second resonator. A resonance frequency of each resonator is responsive to an acceleration, and the light source shines a light beam on each resonator. The resonators modulate the light to a frequency that corresponds to the resonance frequency, and the modulated light is sensed at each resonator by a corresponding photodetector. The photodetectors generate first and second electrical output signals in response, and these electrical output signals are used to generate a temperature independent acceleration measurement. In addition, a plurality of electrodes are disposed in relation to each resonator, such that one or more proof masses associated with each resonator may be dynamically balanced and/or a scale factor associated with the modulated light increased or decreased as a function of acceleration.

Exemplary technical effects of the resonant electro-optical accelerometer described herein include, for example: (a) optical self-excitation and detection; (b) real-time dynamic resonator balancing; (c) real-time adjustments to scale factor; and (d) differential resonator output for temperature independent acceleration measurement.

Exemplary embodiments of a resonant opto-mechanical accelerometer and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where acceleration measurement is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An accelerometer comprising:
a membrane comprising a mounting perimeter, a central portion, a first leaf, a first spring, a second leaf, and a second spring, wherein the first leaf is coupled to the central portion by the first spring, and wherein the second leaf is coupled to the central portion by the second spring;
a laser source, the laser source producing a laser beam, the laser beam directed at the central portion of the membrane and configured to cause the membrane to vibrate;
a transparent cap, the transparent cap disposed between the laser source and the membrane;
an antireflecting film disposed on an outer surface of the transparent cap; and
a detector configured to sense a reflected portion of the laser beam, the reflected portion comprising a modulated intensity,
wherein an acceleration signal is based in part on a frequency of a modulation of the reflected portion of the laser beam.

2. The accelerometer of claim 1, wherein the antireflecting film comprises a thickness between about 50 nm and about 500 nm.

3. The accelerometer of claim 1, wherein the antireflecting film comprises multiple layers, and wherein at least one layer of the multiple layers comprises a medium refractive index material.

4. The accelerometer of claim 1, wherein the antireflecting film comprises at least one of tantala, MgF2, SiN, TaOx, HfOx, and YOx.

5. The accelerometer of claim 1, wherein the antireflecting film comprises a refractive index between about 1.3 and about 5.

6. The accelerometer of claim 1, further comprising a vacuum gap disposed between the transparent cap and the membrane,
wherein a thickness of the vacuum gap is between about 2 microns and about 50 microns.

7. The accelerometer of claim 1, wherein the transparent cap comprises at least one of silica, borosilicate glass, SiO2, silicon, and boron trioxide.

8. The accelerometer of claim 1, further comprising a multilayer antireflective coating.

9. The accelerometer of claim 1, further comprising a reflective coating disposed on an inside surface of the transparent cap,
wherein the reflective coating comprises a reflectance between about 20% and about 80%.

10. The accelerometer of claim 1, wherein the antireflecting film further comprises an index-matching fluid disposed between the laser source and the transparent cap.

11. The accelerometer of claim 10, wherein the laser source comprises at least one optical fiber.

12. The accelerometer of claim 1, wherein the antireflecting film suppresses reflections from the outer surface of the transparent cap.

13. The accelerometer of claim 1, wherein the antireflecting film reduces reflectance from the outer surface of the transparent cap to 10% or less.

14. An accelerometer comprising:
a membrane comprising a mounting perimeter, a central portion, a first leaf, a first spring, a second leaf, and a second spring, wherein the first leaf is coupled to the central portion by the first spring, and wherein the second leaf is coupled to the central portion by the second spring;
a laser source, the laser source producing a laser beam, the laser beam directed at the central portion of the membrane and configured to cause the membrane to vibrate;
a transparent cap, the transparent cap disposed between the laser source and the membrane;
at least one film disposed on an inner surface of the transparent cap between the laser and the membrane; and
a detector configured to sense a reflected portion of the laser beam, the reflected portion comprising a modulated intensity,
wherein an acceleration signal is based in part on a frequency of a modulation of the reflected portion of the laser beam.

15. The accelerometer of claim 14, the at least one film further comprising:
a first layer having a high refractive index, the first layer adjacent the transparent cap;
a second layer having a low refractive index, the second layer adjacent the first layer; and a third layer having a high refractive index, the third layer adjacent the second layer.

16. The accelerometer of claim 15, wherein each of the first and third layers further comprise at least one of Ta2O5 and TiO2.

17. The accelerometer of claim 15, wherein the second layer further comprises at least one of SiOx and SiO2.

18. The accelerometer of claim 14, wherein the at least one film comprises a reflectance between about 20% and about 80%.

19. An accelerometer comprising:
   a membrane comprising a mounting perimeter, a central portion, a first leaf, a first spring, a second leaf, and a second spring, wherein the first leaf is coupled to the central portion by the first spring, and wherein the second leaf is coupled to the central portion by the second spring, the membrane being at least partially transparent;
   a laser source, the laser source producing a laser beam, the laser beam directed at the central portion of the membrane and configured to cause the membrane to vibrate;
   a transparent cap, the transparent cap disposed between the membrane and the laser source;
   a first antireflecting film disposed on an outer surface of the transparent cap;
   a second antireflecting film disposed on an inner surface of the transparent cap;
   a reflecting layer disposed beneath the membrane; and
   a detector configured to sense a reflected portion of the laser beam, the reflected portion comprising a modulated intensity,
   wherein an acceleration signal is based in part on a frequency of a modulation of the reflected portion of the laser beam.

20. The accelerometer of claim 19, wherein the reflecting layer is disposed on an opposite side of the membrane from the transparent cap.

* * * * *